US005369604A

United States Patent [19]

Ravindranath et al.

[11] Patent Number: 5,369,604

[45] Date of Patent: Nov. 29, 1994

[54] TEST PLAN GENERATION FOR ANALOG INTEGRATED CIRCUITS

[75] Inventors: Naiknaware Ravindranath; G. N. Nandakumar; Srinivasa R. Kasa, all of Bangalore, India

[73] Assignee: Texas Instruments Incorporated, Dallas, Tex.

[21] Appl. No.: 13,903

[22] Filed: Feb. 5, 1993

[51] Int. Cl.[5] .................... G05B 19/02

[52] U.S. Cl. .................... 364/580; 364/578; 364/481; 324/73.1; 324/158.1

[58] Field of Search .................... 364/578, 580, 481, 485; 324/73.1, 158 R

[56] References Cited

U.S. PATENT DOCUMENTS

| | | | |
|---|---|---|---|
| 4,000,460 | 12/1976 | Kadakia et al. | 324/73 |
| 4,204,633 | 5/1980 | Goel | 324/73 R |
| 4,228,537 | 10/1980 | Henckels et al. | 324/73 R |
| 4,656,632 | 4/1987 | Jackson | 324/73 R |
| 4,907,230 | 3/1990 | Heller et al. | 371/22.1 |
| 5,105,373 | 4/1992 | Rumsey et al. | 364/578 |

*Primary Examiner*—Jack B. Harvey
*Assistant Examiner*—Craig S. Miller
*Attorney, Agent, or Firm*—Robby T. Holland; Wade J. Brady, II; Richard L. Donaldson

[57] ABSTRACT

A method of generating a test plan for a circuit designed with blocks of analog, digital, or mixed signal components. Each block is treated as a separate functional unit, with a test having block inputs that are set to predetermined values. A matrix of circuit equations is set up to determine what circuit inputs will result in these block inputs. The required number of equations is obtained by identifying any circuit inputs that need to be set heuristically.

9 Claims, 2 Drawing Sheets

TEST PLAN GENERATION FOR ANALOG INTEGRATED CIRCUITS

TECHNICAL FIELD OF THE INVENTION

This invention relates to testing of integrated circuits, and more particularly to a method for automatically generating a test plan for an integrated circuit having analog and mixed signal components.

BACKGROUND OF THE INVENTION

The number of components that can be integrated onto a semiconductor chip has been increasing rapidly. At the same time, the number of different types of integrable components has also increased. Today's integrated circuits (IC's) may have analog, digital, or mixed signal components or some combination of these types.

Testing analog and mixed signal IC's poses problems different from those encountered in testing digital integrated circuits. Analog and mixed signal IC's deal with analog signals, and the transistors as well as other components may or may not operate in a linear manner.

Analog circuit testing is generally "functional" in that it attempts to associate defects in the circuit with failure of the circuit to perform its intended function. One approach to functional testing is to conceptualize the circuit as a set of functional modules. This reduces the complexity of the test operation as compared to testing each primitive component of the circuit.

When the circuit is not integrated, block functional testing is not especially difficult. Each block is tested separately by applying input signal values and measuring outputs.

For IC's, functional testing is easily implemented in "end to end" testing of the entire circuit, because the circuit inputs and outputs are available for applying input signals and measuring outputs. However, for block level testing, where a block has one or more inputs or outputs that are not the same as the circuit inputs or outputs, test values cannot be physically applied to the block inputs and block outputs cannot be physically measured.

One solution to block functional testing is to manually propagate block inputs and outputs to circuit inputs and outputs. In the past, this has been done manually, but for complex circuit that computational burden is large. Automated techniques for backward and forward propagation have also been described. U.S. patent Ser. No. 970,973, now abandoned entitled "A Method for Generating Analog Test Plans", assigned to Texas Instruments, Incorporated, describes a method for testing analog integrated circuits, using forward and backward path propagation. Test values to be applied to block inputs and expected values at block outputs are attempted to be propagated to the circuit inputs and outputs.

Existing test plan generation methods fail to provide tests under some circumstances. For example, they do not provide tests that require current setting, ac analysis, or transient analysis. They do not provide tests for circuits with feedback. A need exists for a method for generating all types of tests for all types of analog circuits.

SUMMARY OF THE INVENTION

A first aspect of the invention is a method of using circuit simulation techniques to generate a test plan for a circuit comprised of blocks of analog, digital, or mixed signal components, or some combination of these components. The method treats each block separately, and performs an iterative process of attempting tests, methods of tests, and heuristic solutions. Accordingly, a first step is selecting a block of the circuit as the current block under test. Then, a first test to be performed on said block is selected. The test designates certain inputs that are to be set with predetermined test values and certain outputs that are to be measured and compared to expected values. The block's inputs are set by assigning the test values to them. To reduce the number of unknown variables, so that a solvable matrix can be formed, it is determined if any circuit inputs need to be identified and set heuristically. If so, these inputs are identified by using heuristic rules, and set to some value. A matrix of circuit equations is formed, which can be solved for circuit input values that will result in the test values at the block inputs. Now, the matrix can be solved to determine values to be applied to circuit inputs during testing. The matrix solution also includes expected circuit outputs. The test plan lists these circuit input values, and the circuit output(s) to be measured.

The method of the invention provides a set of circuit input values that are "consistent with" block inputs, in the sense that these circuit inputs will result in desired block inputs. Likewise, at least one circuit output is provided that is consistent with an expected block output. These consistent values to be applied and measured at the circuit pins may be different from the values specified for block pins by the test model.

A technical advantage of the invention is that it automatically generates tests for linear and non-linear analog sub-circuits within an integrated circuit. It can be used with various types of functional tests, including DC, AC, and transient response analysis. On the average, the generation of the test plan takes less time than previous automated methods. This is at least in part due to the use of functional block models as a basis for test plan generation, rather than transistor level models. It generates tests that could not be generated with previous methods, such as those that have current values to be set at block inputs.

COPYRIGHT

A portion of the disclosure of this patent document contains material which is subject to copyright protection. The copyright owner has no objection to the facsimile reproduction by any one of the patent disclosure, as it appears in the Patent and Trademark Office patent files or records, but otherwise reserves all copyright rights whatsoever.

DETAILED DESCRIPTION OF THE INVENTION

I. Test Plan Generation

Figure 1:
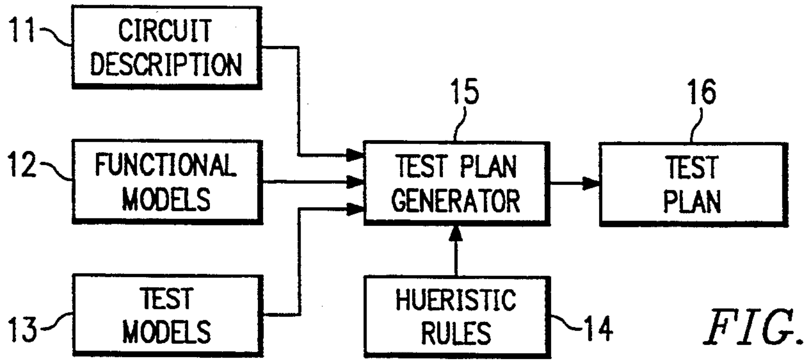
FIG. 1 illustrates the basic steps of generating a test plan in accordance with the invention.

FIG. 1 illustrates the basic steps of the process of generating a test program in accordance with the invention. Each of the steps of FIG. 1 will be explained in general terms in this Part I. In Part II, the same steps are described in terms of a simple example circuit.

As is evident from the following description, this method may be implemented with a test generator program for a computer, which accesses certain predefined data files and libraries and generates a test plan. Many of the circuit descriptions, functional models, and test models used as input for the test plan generator can be derived from existing libraries in the form of computer databases. Various parsing routines can be used to adapt data in these libraries to the syntax of the test plan generator.

In general, the method applies to an analog or partly analog modular circuit, in which sub-circuits are defined in terms of functional blocks. For implementation of the computer-based method, a circuit description, a set of functional models for its blocks, and a set of test models for these blocks are input to a test plan generator. Block by block, the functional and test models are used to determine the relationship between known inputs and expected outputs for each block. For each block, the test plan generator determines what values should be applied to the circuit inputs to produce those block inputs, as well as the value at the circuit output that will result from the block output. In other words, the circuit inputs will result in the values listed in the test model at the block inputs. In this manner, the test plan generator produces a set of consistent circuit values to be applied and measured at the circuit level when the block is under test. The calculation of the circuit values is done by means of circuit simulation, using a matrix of circuit equations. The result is a test plan, in which known circuit inputs can be applied to an IC, and the resulting outputs compared to expected results for the circuit.

In accordance with the preceding overview, it is assumed that the circuit to be tested has a modular design, in which each module can be described with a high level functional model. These-modules are referred to herein as "blocks". The functional models can be derived or are available from electronic design software packages.

As indicated in step 11, the IC under test is expressed in terms of a schematic description, interpretable by computer. Known methods of generating such a description may be used, such as schematic capture software, circuit synthesis software, or hardware description languages.

The circuit is expressed in terms of "blocks". One block is the "circuit block" which represents the entire circuit. Other blocks represent sub-circuits. Each sub-circuit block identifies its own block inputs and block outputs, so that circuit simulation can be performed with test voltages and currents set at block inputs. As explained below, the circuit simulation is in the form of a matrix of equations representing the circuit and the unknown currents and voltages in the circuit. The matrix is solved for these unknown values.

For purposes of this description, block input and output nodes, as well as those of the circuit, are referred to as "pins". It should be understood, however, that although all pins of the circuit are physically accessible, those of the blocks may be either internal or the same as those of the circuit.

In step 12, each block of the circuit is described with a functional model of its operation, which describes the behavior of the block across its inputs and outputs. The functional models are independent of the block under test, in the sense that two blocks in the circuit that are internally the same, i.e., have the same type of components, will have the same functional model with different values to be associated with the model's parameters. For example, two resistors would have the same functional model, but can have different resistance values. Or, as another example, all operational amplifiers (op amps) in a circuit might have similar input versus output characteristics, but can have different CMRR, open loop gain, etc., parameters.

The functional models may be created using techniques known in the art of electronic circuit analysis. They will generally be a set of mathematical parameters and equations describing the characteristics of the block. For example, the Shockly equation might be used to describe the operation of a diode. For use with a computer as in the invention, known modeling languages can be used. Examples of commercially available models are those provided by the SPICE circuit simulation program or written in the MAST analog behavioral description language used for the SABER simulator.

Typically, the functional models for the blocks of a particular circuit will be already stored in a library of functional models. Thus, in practice, step 12 will be implemented by accessing this library and parsing the data to form a functional model data structure for each block.

In step 13, a test model for each block of the circuit is created. A block's test model gives information about the tests that may be performed on that block. As is the case for functional models, any two or more identical blocks will have the same test model. These test models assume that the block is a stand-alone circuit, with all inputs and outputs accessible for application of test voltages and currents.

Depending on the type of block, its test model might have more than one test. Furthermore, each test might have more than one method. Within each method, certain block parameters are "set values" and other parameters are "measured values". The set values are set by assigning them specific voltage or current values. The measured values represent values that would be measured while the block is operating. The measured values are compared to an expected output value, or used to calculate some other value that is compared to an expected output value. If comparison is favorable, the block can be assumed to be operating correctly. The test type may be dc, ac, or transient. For ac tests, the test method may also specify frequency values.

As with the functional models, the test models are parsed or otherwise processed to create a test model data structure for each block.

Step 14 is creating a set of rules for heuristically determining whether any circuit inputs are to be identified and set during the generation of the test for each block in the circuit. If there are such circuit inputs, they are identified and set. This step ensures that sufficient equations are available for solving a circuit matrix. Details of this step are discussed below in connection with FIG. 2.

In step 15, the test plan generator performs an iterative, block-by-block, test generation process. determines how to relate the tests for each block to the actual input and output pins of the circuit. Paths from the non-heuristically identified circuit inputs to block inputs that are to be set with test values are identified. Also, a path from the block output that is to be measured for a test output is identified. If there are mixed signal blocks in the paths, appropriate pins are identified and set. Details of this step, in which each block has different variables for simulating the circuit with a different matrix, are explained below in connection with FIG. 2.

In step 16, the output of the test plan generator is a set of tests for each block in the circuit that has analog or mixed signals. Each test lists the current, voltage and frequency values to be set, as well as values to be measured, at circuit pins. This test plan can be converted to a test program specific to available test equipment.

Figure 2:
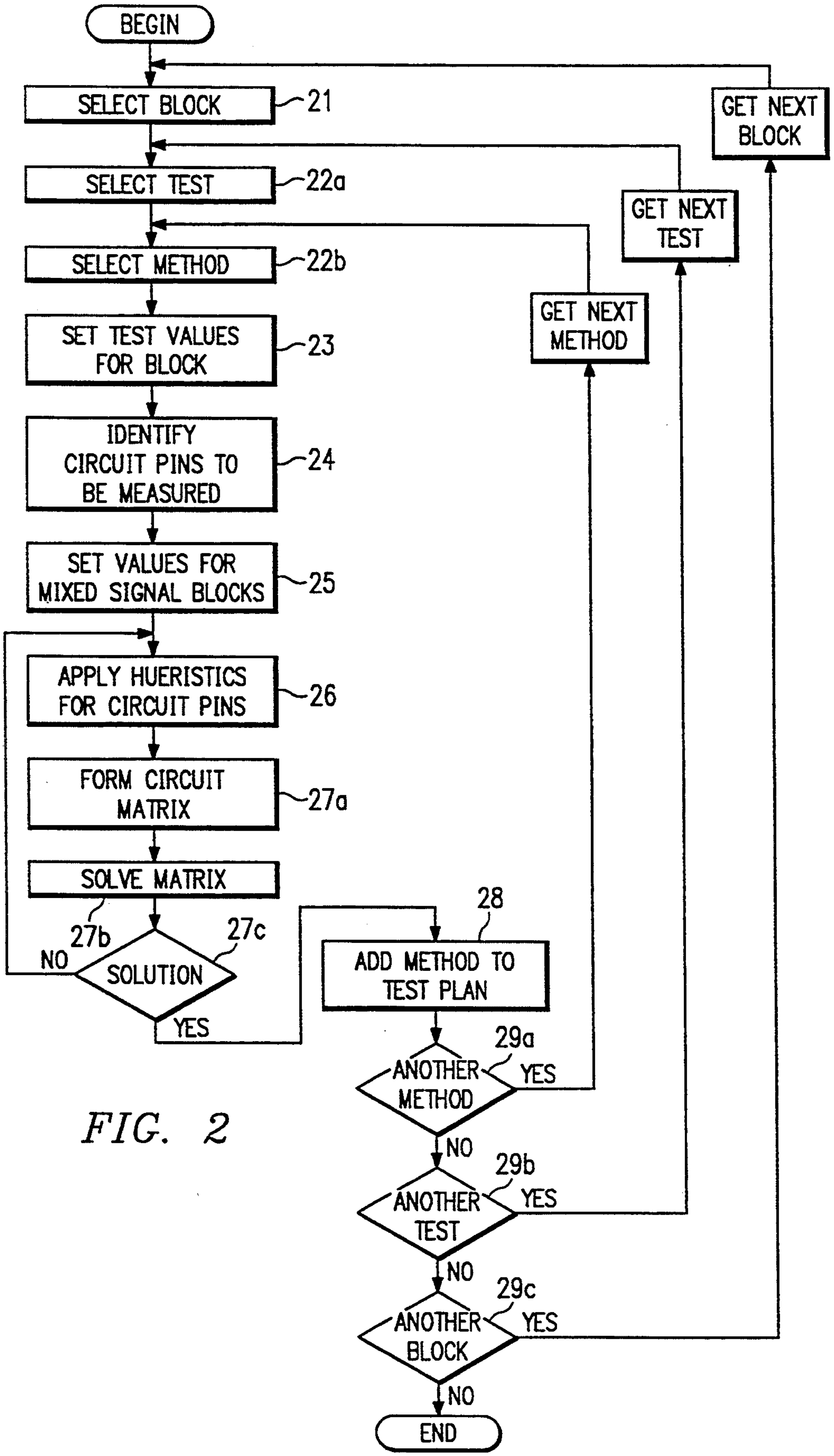
FIG. 2 illustrates the details of the test generation step of FIG. 1.

Referring now to FIG. 2, the process of generating the test plan is iterative, such that each block of the circuit under test is separately analyzed. For each block, different tests, as well as different methods within each test, may be attempted.

The process of FIG. 2 may be implemented with a computer program to be run on any computer processing device. It is assumed that the computer program is ready with the data structures discussed above in connection with FIG. 1, in particular, a circuit description, a set of functional models, and a set of test models.

In step 21, a first block of the circuit is selected from the circuit description for analysis. Because the method of this invention is designed for analog testing, blocks that have completely digital inputs and outputs are not considered. However, mixed signal blocks can be tested insofar as digital inputs and outputs will be assigned high or low voltage values.

In step *22a*, a first test for that block is selected. In step *22b*, a method from that test is selected.

In step 23, the test model is used to provide a set of test input values for the block under test. These values are assigned to appropriate block input nodes.

The block inputs to which the test values are assigned may or may not be directly accessible by means of the inputs and outputs of the IC. In other words, if the block is "internal" one or more of its block inputs or outputs will not be the same as the circuit input or output pins. Often, the number of circuit inputs and outputs exceeds the number of block inputs and outputs. For a given set of block inputs, consistent values at circuit inputs can be calculated by means of the matrix calculation of steps *27a*–*27c*. However, because there are usually more circuit pins than block pins, some pins must be set before the matrix can be solved. A feature of the invention is that these pins are heuristically identified to provide the best circuit simulation.

Also, as part of step 23, circuit power pins are identified and set. Values for these pins can be provided by the circuit database.

In step 24, circuit paths are "sensitized" for simulation purposes. For this, each measured value from the test model is assigned to an appropriate output node and a path to a circuit output selected. A list of all circuit outputs connected to the block output is generated, i.e., an "output pin list".

A feature of the invention is that paths containing mixed signal blocks may also be sensitized. It is necessary to find any mixed signal blocks in the path to a circuit pin and to set certain pins of the mixed signal block so that a circuit simulation can be performed. More specifically, to select a path, step 24 operates on each pin of the block under test. If the pin is a circuit input, no further action is taken. If the pin is a circuit output, it is included in the output pin list.

If the block pin is not a circuit pin, all blocks connected to it are identified. Then, for each of these blocks, it is determined whether any pin of that block is a "control" type pin, and if so, the block is identified as a mixed signal block. If this pin is an output pin, any one input pin and this output pin will be activated. If this pin is an input pin, any one output pin and this input pin are sensitized. If any sensitized pin is a circuit pin, step 24 stops here. If no pin of the block is a control type pin, the block is not a mixed signal block, and if its connected pin is a circuit output, that output is included in the output pin list.

For each input pin of the block under test, the above routine is performed once for each block output. For each output pin of the block under test, the function is called once for each block input. Appendix A is an example of an implementation of step 24.

As a result of step 24, all circuit outputs connected to the block under test through purely analog blocks are to be measured. In this case, the output pin list will contain all circuit outputs. For any mixed signal block in the circuit, only a particular path through that block is activated and is of importance for measuring an output value.

Step 25 applies if there are mixed signal blocks in any path to or from the block under test to the circuit inputs or outputs, as determined in step 24. If so, high or low values are set on digital pins, such that the path will be active during simulation. Appendix B describes a sensitivity test that may be used as part of step 25.

Step 26 is heuristically determining which, if any, circuit pins are to be set prior to the matrix solution. To determine if there are such circuit pins, the number of block inputs that will have set values, m, is subtracted from the number of circuit inputs, n. The difference is the number of circuit pins that are to be heuristically set. The number of set values, m, will be the total of block inputs set during step 24, whether by the test model or during power pin setting.

Once it is determined that one or more circuit pins are to be heuristically set, various approaches may be used for identifying them. One approach is a "distance" approach that involves finding distances between each circuit pin and the block under test. The farthest away circuit pin is to be set. The following are exemplary rules for these distance heuristics:

1. The distance across any two pins of a block not under test is equal to the number of pins of that block.
2. The distance across any two pins of the block under test is 1.
3. The primary inputs of the block under test are excluded.
4. The inputs of the blocks following the block under test are preferred to be excluded.

A more detailed discussed of an algorithm for these heuristics is set out in Part III below.

The heuristically identified circuit pin(s) are then assigned an input value. Where, as is the case in this description, KCL equations are used for the matrix, this value will represent an input voltage. The value to which a heuristically determined input is set can be any value within the range of the input pin. This range may be specified, such as in the test block model or elsewhere. For example, if the range is −4.5 volts to 4.5 volts, the voltage may be set anywhere within that range, including 0.

As a result of step 26, a number of heuristic circuit pins have set values. The remaining circuit pins are those that will receive values set by a matrix calculation. This permits formation of a sufficient number of circuit equations to feasibly be solved, i.e., the number of unknowns does not exceed the number of equations.

Step 26 may be used to heuristically identify and set either circuit inputs or outputs. For example, if an output is farthest from the block it may be assigned a value for purposes of matrix solution. However, for purposes of test plan generation, if this is to be a measured output, it will be designated as a value to be measured rather than set.

In step 27a, a matrix of equations for solving the circuit is formed. In general, the matrix resembles a conventional circuit simulation matrix. However, the variables for which it is solved are different from those of conventional simulation. Some known variables are set heuristically and others are represented in the matrix by block inputs. By solving the matrix, consistent circuit input values that will result in the desired test input values at the block under test are calculated.

For forming the matrix, KCL equations are extracted from a circuit graph of paths and nodes. These equations are stored in the form of a matrix. Each row of the matrix corresponds to a node and each column corresponds to a path, as described by the circuit graph. Matrix entries can be −1, 0, or 1. If the path is not connected to the node, the entry is 0. If current on the path is entering the node, the entry is 1. If current on the path is leaving the node, the entry is −1. A KCL equation is available for each node that is not a circuit input or ground pin. Additional equations are supplied by the functional models for the blocks.

Mathematically speaking, a system of n equations, having n unknowns, is formed. As described in step 26, when there is a fewer number of available equations than circuit unknowns, some unknowns are set heuristically so that the number of unknowns is the same as the number of available equations. Thus, the number of equations in the matrix is the sum of the number of KCL equations plus a number of equations derived from blocks of the circuit.

In step 27b, the matrix is attempted to be solved. The techniques used to solve the matrix include traditional numerical methods. Appendix C describes a solution routine in detail. In general, a column matrix, G(x(k)), is set up, and its derivative square matrix, J, is calculated. During each iteration of a Newton-Raphson procedure, the G matrix and J matrix are updated by solving the functional model of the block under test.

If the matrix is not able to be solved, step 26 is repeated with different heuristic rules or different heuristically derived pins or with different values on the same heuristically derived pins. Step 27a is repeated to form a new matrix, and step 27b is repeated to attempt to solve it. If the program is unable to create any test for the block, it outputs a message to the user so that design engineers can redesign the circuit to make it testable.

Step 28 is performed when step 27b results in a solution to the matrix. The solution of the matrix provides circuit input values that are consistent with the block input values provided by the block test model. It also provides at least one circuit output value consistent with the expected block output value provided by the test model. In other words, because the block voltages, circuit voltages, and all currents in the circuit block, form a part of the circuit matrix, all these values become determined. The test method, with the measured circuit output(s) and with the circuit inputs heuristically set in step 26 or calculated in step 27b, is added to the test plan.

In step 29a, it is determined whether another test method remains to be tried for the block. If so, steps 23–28 can be repeated for that method. Step 29a is optional, in the sense that if one test method is successful, it may be expedient to immediately go to step 29b to determine if there are additional tests for the block, or to step 29c to determine if there are additional blocks to be tested.

The above-described process is especially useful for analog and mixed signal integrated circuits. If the circuit has digital blocks, they can be masked during test generation. Also, the method could be used for functional testing of digital blocks, where instead of logic decisions, high and low voltages are set and measured.

II. Example Circuit for Test Plan Generation

Figure 3:
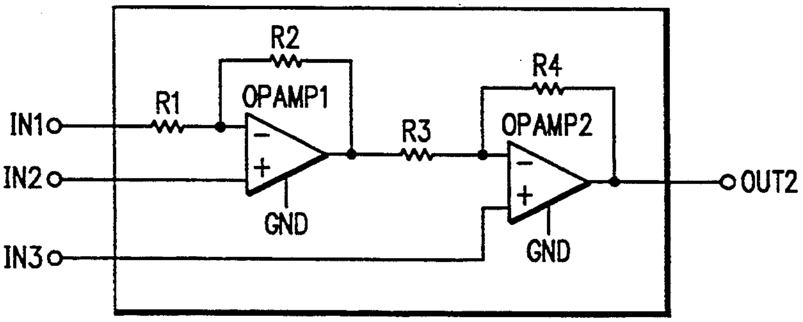
FIG. 3 is an example of an analog circuit to be tested using the method of the invention.

FIG. 3 is a schematic diagram of a simple circuit, for which a test plan may be generated in accordance with the invention. It is referred to herein as a "cascaded op amp" circuit, comprised of two operational amplifiers with feedback and input resistors.

In accordance with step 11 of FIG. 1, the circuit is described in terms of a circuit block, CASCADE, and two internal blocks, RESISTOR and OP AMP. The internal blocks correspond to functional models that are available for op amps and resistors. Using these blocks, the circuit description could be:

```
BLOCK CASCADE;
      IN1            @ (INPUT);
      IN2            @ (INPUT);
      IN3            @ (INPUT);
      OUT2           @ (OUTPUT);
      GND            @ (INOUT);
      STRUCTURE
          RES1       : Resistor     IN1, IN_MINUS;
          OPAMP      : Op amp       IN_MINUS; IN2; OUT; GND;
          RES2       : Resistor     IN_MINUS; OUT;
          RES3       : Resistor     OUT; IN_MINUS;
          OPAMP2     : Op amp       IN_MINUS2; IN3; OUT2; GND;
          RES4       : Resistor     IN_MINUS2; OUT2;
END CASCADE;
BLOCK RESISTOR;
      A              @ (INPUT);
      B              @ (OUTPUT);
END RESISTOR;
BLOCK OPAMP;
      A              @ (INPUT);
      B              @ (INPUT);
      C              @ (OUTPUT);
```

-continued

```
    GND          @ (INOUT);
END OPAMP;
```

Figure 4:
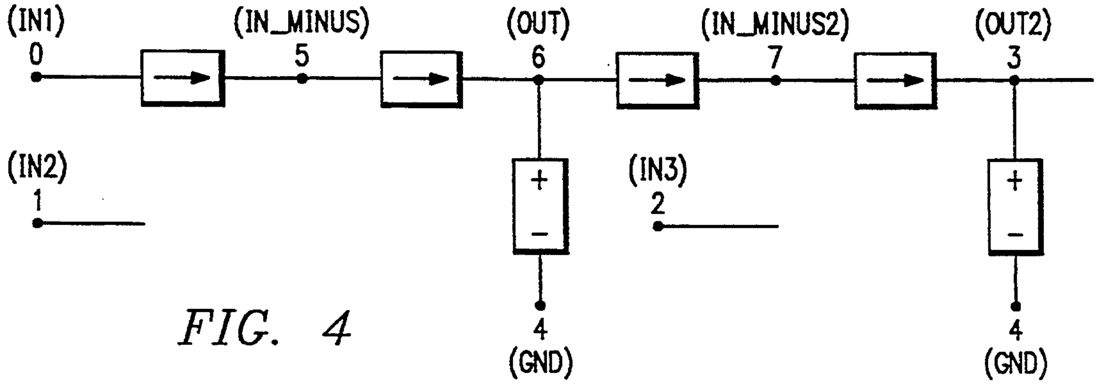
FIG. 4 is a graph of the paths and nodes of the circuit of FIG. 3.

FIG. 4 is an equivalent directional graph of the circuit of FIG. 3, which better illustrates its paths and nodes. The circuit has 6 paths and 8 nodes. Each node is labeled in FIG. 4 with both a variable name and a numerical identifier.

In accordance with step 12 of FIG. 1, each different type of block is associated with a functional model. Thus, the resistor blocks will have the same functional model, as will the op amp blocks.

This example makes use of models available from the commercially available SABER-MAST set of electrical models. For the op amp blocks, where the inputs are at nodes A and B and the output at node C, the model is expressed as:

```
        element template opamp A B C GND = gain, voo
        electrical A, B, C, GND
        number                gain
        number voo
        {
                val v Vout, Vin
                var i i1
                number tmp
                values {
                        Vout = v(C)
                        Vin = v(B) - v(A)
                }
                equations {
                        i(C) += i1
                        i1 : Vout = gain * Vin
                }
        }
A model for the resistors is:
        template resistor A B = r
        electrical A, B
        number r
        {
                val v v1, v2
                val i i1
                values {
                        v1 = v(A)
                        v2 = v(B)
                        i1 = (v1 - v2) / r
                }
                equations {
                        i (A -> B) += i1
                }
        }
```

In accordance with step 13 of FIG. 1, test models for each type of block are derived. For the op amp blocks, there are two tests, one for output voltage, Voo, and one for gain:

```
OPAMP ( ) {
    TEST VOO {
        TEST_TYPE = DC;
        METHOD 1 {
            MTYPE = CHAR;
            ACCESS { C }
            CONTROL { A, B }
            PROCEDURE {
                SET vB = 0 V;
                SET vA = 0 V;
                MEAS vC;
                ASSIGN vO = vC V;
                COMPARE (vO = voo_nom );
            }
        }
    } ENDT TEST_VOO
    TEST GAIN {
```

-continued

```
        TEST_TYPE = DC;
        METHOD 1 {
            MTYPE = CHAR;
            ACCESS { C }
            CONTROL { A,B }
            PROCEDURE {
                ASSIGN v1 = (vstart + (vend)) / 2V;
                SET vA = v1 V;
                SET vB = v1 V;
                MEAS vC;
                ASSIGN v2 = vC V;
                SET vB = v1 V;
                ASSIGN v4 = (( (vstart) + (vend) )
                                  / 2) + 0.0001 V;
                SET vA = v4 V;
                MEAS vC;
                ASSIGN v3 = vC V;
                ASSIGN g1 = (v3 - v2) / 0.0001 V;
                COMPARE (g1 = gain_nom);
            }
        }
    } ENDT TEST_GAIN;
} ENDF OPAMP;
The test model for the resistors is:
RESISTOR ( ) {
    TEST R {
        TEST_TYPE = DC;
        METHOD 1 {
            MTYPE = PROD;
            ACCESS { A }
            CONTROL { B }
            PROCEDURE {
                SET vA = 2V;
                SET vB = 0V;
                MEAS iA;
                ASSIGN rval = 1/iA;
                COMPARE (rval = r_nom);
            }
        }
    } ENDT TEST_R
    TEST RCURR {
        TEST_TYPE = DC;
        METHOD 1 {
            MTYPE = PROD;
            ACCESS { A }
            CONTROL { B }
            PROCEDURE {
                SET vA = 2V;
                SET iA = 0.1A;
                MEAS vB;
            }
        }
    } ENDT TEST_RCURR;
}ENDF RESISTOR;
```

At this point, the inputs for the test plan generator, as illustrated in FIG. 1, are complete. Referring now to FIG. 2, each block of the cascaded op amp circuit is separately processed to obtain a test plan for that block.

The following description assumes that the block currently being processed is the RES1 block of FIG. 3. Thus, in accordance with step 21 of FIG. 2, the selected block is RES1.

In step 22*a*, a first test for the resistor is selected for consideration. This is the R test of the resistor test model described above. It has only one method, and step is selecting that method.

In step 23, the values to the block nodes are set in accordance with the test model. Thus, IN1, which corresponds to node A of RES1 is set to 2 volts. IN_MI- NUS, which corresponds to node B of RES1, is set to 0 volts.

In step 24, a path is traced from the block output to a circuit output. This identifies OUT2 as a node at which a circuit measurement will be made during testing. Also, GND is identified as a power pin and set to 0.

Step 25 is forming the matrix for the circuit. There are four nodes other than circuit input nodes. Referring to FIG. 4, these nodes are OUT2, IN_MINUS, OUT, and IN_MINUS2. The KCL equations for these nodes, where imn represents the current, i, between nodes m and n, are:

|              |                      |     |
|--------------|----------------------|-----|
| At OUT2      | i73 − i34            | = 0 |
| At IN_MINUS  | i05 − i56            | = 0 |
| At OUT       | i56 − i64 − i67      | = 0 |
| At IN_MINUS2 | i67 − i73            | = 0 |

The KCL matrix for these equations is set up such that each row represents a KCL at a different node. Each column represents a path. Thus, where node 4 (GND) is set at 0 volts:

| node 3 | 000  | 000 | 001 | −001 | 000  | 000  |
|--------|------|-----|-----|------|------|------|
| node 5 | −001 | 000 | 000 | 000  | 001  | 000  |
| node 6 | 000  | 001 | 000 | 000  | −001 | 001  |
| node 7 | 000  | 000 | 000 | 001  | 000  | −001 |

An additional 8 equations are available to represent circuit blocks. Referring to the functional models set out above, each resistor contributes one equation, and each op amp contributes two. Thus:

|           |                          |
|-----------|--------------------------|
| RES1 −>   | i15 = (v0 − v5) / res1   |
| RES2 −>   | i56 = (v5 − v6) / res2   |
| RES3 −>   | i67 = (v6 − v7) / res3   |
| RES4 −>   | i73 = (v7 − v3) / res4   |
| OPAMP1 −> | v6 = (v0 − v1) * gain1   |
|           | i64 = i1 (of op amp 1)   |
| OPAMP2 −> | v3 = (v7 − v2) * gain2   |
|           | i34 = i1 (of op amp 2)   |

Thus, the total number of available equations is 12. However, the number of unknown variables is 13: i05, i56, i64, i67, i73, i34, v1, v2, v6, v7, v3, i1 (op amp 1), i1 (op amp 2).

Step 26 begins with determining how many values are to be set heuristically. For this determination, the number of nodes with set values is subtracted from the number of circuit inputs. In this example, there are 4 circuit inputs and 3 set values. (As indicated above, the node GND is considered a circuit input and its value is set by default to 0). Thus, one value needs to be set heuristically.

Step 26 also involves identifying each node to be set. Using distance heuristics, the distances between the input to RES1 and other circuit inputs are calculated. circuit. As indicated, for each test, the plan lists provides input values for the IN1, IN2, IN3, and GND. It also provides an expected value for the circuit output, OUT2. During testing, each test is performed and OUT2 measured. The measured value is then compared to the expected output value.

III. Distance Heuristics

One method for identifying circuit pins that should be set heuristically is to form a D matrix. This matrix has dimension x by x, where x is the number of nodes in the circuit.

The elements of the D matrix are filled with infinity values, i.e., very large numbers. Then, the D matrix is weighted such that $$D = [d(i,j)]$$

, where $d(i,j)$ = complexity of the block through which nodes i and j are connected $d(i,i) = 0$.

In other words, if the complexity of the block at (i,j) is less that infinity, that number is used instead of infinity.

Then, for each pair of pins of the block under test, zeros are entered for the corresponding element in D. As a result, all nodes around the block are "fused" together as a single block node. Then, the shortest path from this "fused" node to each node that is a circuit pin is calculated. An algorithm known as Dijkstra's algorithm may be used for this calculation. The result is a list of distances from the block to each circuit pin, from which the longest distance may be selected.

Other Embodiments

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

Node 2 (IN3) has a distance of 9 units from RES1. Node 1 (IN2) has a distance of 3 units. Thus, node 2 is the farthest node from the block under test. It is set to an arbitrary value, such as 0. The remaining circuit inputs (IN2) is matched to a block inputs. Thus, the value to be solved for is IN2, which will provide an input signal to be applied during testing so that 0 volts will appear at IN_MINUS. There are now 12 unknown variables and 12 matrix equations. The matrix may now be solved.

The result of steps 22-28 is a test plan for the block. Appendix D is a test plan generated for the example

APPENDIX A

```
sensitze_path()
{
   if (the pin passed to this function is a design input) return ;
   if (the pin is  a  design output) {
        include_pin_in_measure_pin_list();
        return;
   }
    for (each connected block to the pin) {
        if  (block_has_digital_pin)  {  /* a  mixed mode block.  */
            if (block has a output pin)
                any  one  input  pin  and this output pins are sensitized(a flag is put).
            if (block has an input pin)
                , any one  output  pin  and  this  input  pin  are sensitized.
            if (pins sensitized are design IOs) return;
                else senstize_path(); /* Recursively called with the current block
                                       and the sensitzed pin */
        else {                         /* an analog block */
            if (pin is an Input pin), senstize_path(); /* Recursively called with the current block
                                       and each of the output pin */

            if (pin is an Output pin) sensitize_path;/* Recursively called with the current block
                                       and each of the input pin */
            if ( pin is a design input) return;
            if (pin is a design output) include_pin_in_measure_pin_list();
    }
 }
```

APPENDIX B

```
activate_mixed_mode_blocks()
{
    identify_mixed_signal_blocks(); /* Blocks having both analog and digital pins */
    for(each_identified_mixed_signal_block)
        {
            for(each_digital_pins_combination)
                set sensitized pins to normal voltages;
                compute voltage at the sensitized output pin, v1;
                change the voltage at the sensitized input pin by delta
                compute the output voltage, v2;
                sensitivity = (v2 - v1) / delta;
        }
        select most sensitive combination of digital pins;
}
```

APPENDIX C

```
------------------------------

/* Comments are written next to each procedure */
/* Refer NRdesign.doc for details of the design. */

#define  MAXITERATION  5
#include "includes.h"
#include <math.h>
#include "NetlistFuncTypes.h"
#include "solution.h"
#include "linatgMath.h"
#include "Functionality.h"

#include "UtilFuncTypes.h"
#include "ModelFuncTypes.h"

/*
  Following variables are global, but scope is kept only for this file.
*/
    int totalUnknownPaths =0;     /* Number of paths in the circuit */
    int totalPaths        =0;
    int totalUnknownGroups=0;     /* Number of groups (nodes) in the circuit */
    int totalGlobalVars   =0;     /* Number of global variables in the circuit *
    int totalVariables    =0;     /* Total variables in the circuit */

    int totalModelEquations=0;    /* Total model equations in a block */

    int totalSetValues   =0;      /* Total values set by the test */
    int totalKCLeqns     =0;      /* Total KCL equations */
    int totalEquations   =0;      /* Total equations */

    double *Jacobian=NULL;        /* The Jacobian */
    double *Cmatrix =NULL;        /* The C matrix */
    int  dimension   = 0;

#define DELTA  (0.05)

    int totalValuesToSet = 0; /* Total values to be set by heuristics */

/*------------------------------------------------------------------------
/*  The following procdure prints values at each node, and current
through each of the circuit */
int printNodesPaths()
{
  GroupDef      *group;
  CircuitPaths *dummyCircuitPath;
  char temp[MAX_LENGTH];

  if(!debugFlag) return;

  fprintf(stderr,     "                 (Comment : Voltages . . .\n");
        for (group = firstGroup; group != NULL; group = group->next)
     {
      fprintf(stderr,"                 %-24s %lf,%lf\n",group->groupName.group->val
     }
      fprintf(stderr,"                 (Comment : Currents . . .\n");
 dummyCircuitPath = circuitDigraph;
 for(dummyCircuitPath =circuitDigraph;dummyCircuitPath; dummyCircuitPath = dumm
 {
      if(dummyCircuitPath -> type == SOURCE)
      fprintf(stderr,"                 %-10s -> %-10s %lf,%lf\n",dummyCircuitPath->
 }
      fprintf(stderr,"                 (Comment : Globals . . .\n");
 dummyCircuitPath = circuitDigraph;
 for(dummyCircuitPath =circuitDigraph;dummyCircuitPath; dummyCircuitPath = dumm
 {
      if(dummyCircuitPath -> type == GLOBAL_VAR)
      {
        sprintf(temp,"%s.%s",dummyCircuitPath->blkPtr->instName,dummyCircuitPat
        fprintf(outputFile,"                 %-10s -> %-10s % lf,% lf\n",temp,dummy
      }
 }

      fprintf(stderr,"                 (Comment : End of printNodesPaths().)\n");
}
/*----------------------------------------------------------------------*/
/* Checks whether the node (group) is connected to the block specified */
int isGroupBlockConnected(GroupDef *group,BlockDef *dummyBlock)
{
PinDef *pin;
  for(pin=dummyBlock->pins;pin;pin = pin -> next)
  {
    if( strcmp(pin->signal->groupName,group->groupName) == 0) return TRUE;
  }
return FALSE;
}
/*----------------------------------------------------------------------*/
       /* Finds the total variables in the system */
int findTotalVariables()
{
 CircuitPaths *dummyCircuitPath;
 GroupDef      *group;
 BlockDef      *dummyBlock;

  /* find total number of global variables  -> Those many global variables */
  /* find total number of paths -> Those many currents */

  totalUnknownPaths        =0;
  totalPaths               =0;
  totalUnknownGroups       =0;
  totalGlobalVars          =0;
  totalGroups              =0;
  totalVariables           =0;

  for(dummyCircuitPath =circuitDigraph;dummyCircuitPath; dummyCircuitPath = dumm
  {
    if(dummyCircuitPath -> known != TRUE)
    {
       if(dummyCircuitPath -> type == SOURCE) totalUnknownPaths++;
       if(dummyCircuitPath -> type == GLOBAL_VAR) totalGlobalVars++;
    }
    if(dummyCircuitPath -> type == SOURCE) totalPaths++;
  }

   /* find total number of nodes -> Those many voltages */
   for (group = firstGroup; group != NULL; group = group->next)
   {
       if(! ( group -> known == TRUE || (strcmp(group->groupName,"GND")==0))) to
       totalGroups ++;

   for(currDistance = firstDistance,i=0;i<(tri     1);i++)
   {
    currDistance = currDistance->next;
    if (currDistance == NULL)
    {
     fprintf(stderr,"?(LinATG) : Sorry! Couldn't unset required number of value
     return 1;
    }
   };

  /* set the values from the next groups */
   for(i=0; i<(totalValuesToSet);i++, currDistance = currDistance->next)
   {
      if(currDistance == NULL)
      {
         fprintf(stderr,"?(LinATG) : Sorry! Couldn't unset required number of v
         return 1;
      }
      group = getGroupPointerFromNumber(currDistance->groupNumber);
      if(debugFlag) fprintf(stderr,"xxxxxxxxxxxxxxxxxxxxxxxxxxxxxxxxxxxxxx\n");
      if(debugFlag) fprintf(stderr,"Unsetting group %s value heuristically....\
      if(debugFlag) fprintf(stderr,"xxxxxxxxxxxxxxxxxxxxxxxxxxxxxxxxxxxxxx\n");
      group->value.rpart = 0;

  }
  /* total number    system variables  -> sum of all the above */
  if(debugFlag) f     tf(stderr,"----------------------------------------\n
  if(debugFlag) fprintf(stderr,"Total paths in the circuit = %d\n", tota
  if(debugFlag) fprintf(stderr,"Total nodes in the circuit = %d\n", tota
  if(debugFlag) fprintf(stderr,"----------------------------------------\n
  if(debugFlag) fprintf(stderr,"Total unknown paths in the circuit = %d\
  if(debugFlag) fprintf(stderr,"Total global variables in the circuit = 
  if(debugFlag) fprintf(stderr,"Total unknown nodes in the circuit = %d\
  totalVariables = totalUnknownPaths + totalGlobalVars + totalUnknownGr
  if(debugFlag) fprintf(stderr,"----------------------------------------\n
  if(debugFlag) fprintf(stderr,"Total variables in the circuit = %d\n",
  if(debugFlag) fprintf(stderr,"----------------------------------------\n
}
/*------------------------------------------------------------------------
int findTotalEquations()
/* Finds total number of eqautions of the system */
{
   CircuitPaths *dummyCircuitPath;
   GroupDef      *group;
   BlockDef      *dummyBlock;
   ModelPaths    *dummyModelPaths;
  /* total number of KCL equations totalGroups - 1, from generate KCL */
  /* total number of equations from the models */
  totalModelEquations =0;
  totalSetValues       =0;
  totalEquations       =0;


  for(dummyBlock = getNextBlk(firstBlock);dummyBlock;dummyBlock=getNextB.
  {
     for(dummyModelPaths = dummyBlock->topFuncModel->paths;dummyModelPat
           dummyModelPaths=dummyModelPaths->next)
     {
       totalModelEquations++;
     }
  }

  /* total set values on the  block under test */
  /* Known voltages */

  for (group = firstGroup; group != NULL; group = group->next)
  {
       if (group -> known == TRUE)  totalSetValues++;
  }

 /* Known currents */
 for(dummyCircuitPath =circuitDigraph;dummyCircuitPath; dummyCircuitPath
 {
   if(dummyCircuitPath -> type == SOURCE && dummyCircuitPath ->known == 
 }
  if(debugFlag) fprintf(stderr,"----------------------------------------\n
  if(debugFlag) fprintf(stderr,"Total set values = %d\n", totalSetValues;
  if(debugFlag) fprintf(stderr,"----------------------------------------\n
  if(debugFlag) fprintf(stderr,"Total KCL equations = %d\n", totalKCLeqn:
  if(debugFlag) fprintf(stderr,"Total equations due to models = %d\n",te
  if(debugFlag) fprintf(stderr,"----------------------------------------\n
  totalEquations = totalKCLeqns + totalModelEquations /* +  totalSetValu
  if(debugFlag) fprintf(stderr,"----------------------------------------\n
  if(debugFlag) fprintf(stderr,"Total equations  = %d\n", totalEquations
  if(debugFlag) fprintf(stderr,"----------------------------------------\n
}

/*------------------------------------------------------------------------
/* Finds total number of values to be set to make the equation set compl
int findTotalValuesToSet()
{
  totalValuesToSet = totalVariables -  totalEquations;
  if(debugFlag) fprintf(stderr,"----------------------------------------\n
  if(debugFlag) fprintf(stderr,"Total values to be set heuristically %d\
  if(debugFlag) fprintf(stderr,"----------------------------------------\n
}
/*------------------------------------------------------------------------
/* Sets values on the selected pins by distance heuristics.
First the  farthest ones are tried, then the next to the farthest
but closer, and so on for each trial.
*/
int setValuesHeuristically(int trialNo)
{
   int i =0 ;
   Distance *currDistance;
   GroupDef      *group;

  if( (totalValuesToSet == 0) && (trialNo > 1) ) return 1;

  /*  fast forward the list upto trialNo. */
   for(currDistance = firstDistance,i=0;i<(trialNo-1);i++)
   {
    currDistance = currDistance->next;
    if (currDistance == NULL)
    {
      fprintf(stderr,"?(LinATG) : Sorry! Couldn't set required number of
     return 1;
    }
   };

  /* set the values from the next groups */
   for(i=0; i<(totalValuesToSet);i++, currDistance = currDistance->next)
   {
      if(currDistance == NULL)
      {
         fprintf(stderr,"?(LinATG) : Sorry! Couldn't set required number
         return 1;
      }
      group = getGroupPointerFromNumber(currDistance->groupNumber);
      if(debugFlag) fprintf(stderr,"-----------------------------------
      if(debugFlag) fprintf(stderr,"Setting group %s value heuristically
      if(debugFlag) fprintf(stderr,"-----------------------------------
      group->value.rpart = 0;
      group->value.ipart = 0;
      group->known = TRUE;
   }
   return 0;
 } /* setValuesHeuristically() */
 /*------------------------------------------------------------------------
 /* If the solution cannot be found with particular setting of the heuris
 trying the next setting, values need to be reset. */
 */
 int unSetValuesHeuristically(int trialNo)
 {
    int i =0 ;
    Distance *currDistance;
    GroupDef      *group;

   if( (totalValuesToSet == 0) && (trialNo > 1) ) return 1;

   /*  fast forward the list upto trialNo. */

}

/*--------------       ------------------------------------------------------
int reportJacobian(double *Jacobian)
{
  /* Finds out which row is zero */
   double sum = 0;
   int i=0;
   int j=0;
   GroupDef    *group;
   CircuitPaths  *dummyCircuitPath;
   ModelPaths    *dummyModelPaths;
   BlockDef      *blkPtr;
   BlockDef      *dummyBlock;
   CircuitPaths *path = NULL;


   for(i=0;i<totalKCLeqns;i++)
   {
       mat_abs_row_sum(dimension,dimension,Jacobian,i,&sum);
       if( fabs(sum) < 1e-99) fprintf(stderr,"Row sum of %dth KCL eqn in
   }
```

```
        group->value.ipart = 0;
        group->known = FALSE;
    }
    return 0;
} /* mnSetValuesHeuristically() */
/*-------------------------------------------------------------------------*/
int computeKCL(int count)
{
/* Computes value of each KCL equation */
    ModelPaths   *dummyModelPaths;
    CircuitPaths *path;
    int pathCount = 0;

    if(debugFlag) fprintf(stderr,"Forming G row %d ...\n",count);
       for(path =circuitDigraph;path;path =path->next)
       {
           if(path->type == SOURCE)
           {

                 pathCount++;
                 if(debugFlag) fprintf(stderr,"%s - %s : Multiplying by : %d\n"
                 *(Gmatrix+count)                +=  (*( KCLmatrix + (pathCoun
                 if(analysisType == AC) *(Gmatrix+count+totalVariables)  +=  (*
           }
       }
}
/*-------------------------------------------------------------------------*/
/* Computes G Matrix, see design document */
int computeGmatrix()
{

   Complex output;
   BlockDef *dummyBlock;
   ModelPaths   *dummyModelPaths;
   int i = 0;

   /* compute first KCL equations */
   /* do with each seruce in diagraph, for all the KCLs. */

  if(debugFlag) fprintf(stderr,"Forming Gmatrix ...\n");
  if(debugFlag) fprintf(stderr,"Forming KCL part of  Gmatrix ...\n");
   for(i=0;i<totalKCLeqns; i++)
   {
    computeKCL(i);
   }
  if(debugFlag) fprintf(stderr,"Formed KCL part of  Gmatrix. It has %d rows\n",
  if(debugFlag) fprintf(stderr,"Forming model part of  Gmatrix ...\n");
  for(dummyBlock = getNextBlk(firstBlock);dummyBlock;dummyBlock=getNextBlk(dumm
  {
     for(dummyModelPaths = dummyBlock->topFuncModel->paths;dummyModelPaths!=NUL
            dummyModelPaths=dummyModelPaths->next)
      {
           if (debugFlag) fprintf(stderr,"%s is (%s   %s)\n",(dummyModelPaths->
            if(debugFlag) fprintf(stderr,"BlockName %s,  Path %s -> %s \n",
                         dummyBlock->instName,
                         dummyModelPaths->startNode,
                         dummyModelPaths->endNode);
/*            debugFlag = FALSE; */
           solveMastModel(dummyBlock, dummyModelPaths,&output);
           *(Gmatrix+i)                    = output.rpart;
           if(analysisType == AC)  *(Gmatrix+i+totalVariables) = output.ipart;
           i++;
      }
   }
   if(debugFlag) fprintf(stderr,"CHECK POINT. Gmatrix elements = %d",i);
   if(debugFlag) fprintf(stderr,"Formed Gmatrix.\n");
}
/*-------------------------------------------------------------------------*/
int fillJacobian(int i, int j,double rpart,double ipart,double *Jacobian)
{
/*

        |¯A1 -A2 ¯|   |¯X1 ¯|    |¯B1 ¯|
        | A2  A1  | * | X2  |  = | B2  |
         -        -    -   -      -   -
*/
        *(Jacobian + i + dimension * j) =  rpart;
        if(analysisType == AC)
        {
         *(Jacobian + i                    + dimension * (j + totalVariables) )
         *(Jacobian + (i+totalVariables) + dimension * j                      )
         *(Jacobian + (i+totalVariables) + dimension * (j + totalVariables) )
        }
}
/*-------------------------------------------------------------------------*/
int mat_abs_row_sum(int m, int n, double *a,int row, double *s)
{
      int j = 0;
      *(s) = 0;
      for (j = 0; j < n; j++)
      {
         *(s) += fabs(*(a + row + (j * m)));
      }
   return 0;
}
/*-------------------------------------------------------------------------*/
int mat_abs_clm_sum(int m, int n, double *a,int clm, double *s)
{
      int i = 0;
      *(s) = 0;
      for (i = 0; i < m; i++)
      {
         *(s) += fabs(*(a + i + (clm * m)));
      }
   return 0;

   {   k = 0;
       j = 0;
       for(path =circuitDigraph;path;path =path->next)
       {
           if(path->type == SOURCE)
           {
                 if(path->known == FALSE)
                 {
                   fillJacobian(i,j, *(KCLmatrix + k * totalKCLeqns + i),0,Jaco
                   j++;
                 }
                k++;
           }
       }
   }

   mat_type("J matrix\n",dimension,dimension,Jacobian);
   if(debugFlag) fprintf(stderr,"Formed KCL part of  Jacobian.\n");
   j=0;  /* Reset the clm number */
       /**
       Finding partial derivatives for KCL is easy. It is the coeft of the
       variable in the eqn.
       copy the rows directly in jacobian.

       For model eqns
       First create a temporary copy of the block whose
       model is to be evaluated.

       Fix  values  of  the  variables  in the block to the current values.(Tak
       vector Xn ). Here we need to map the  node names to the respective pins
       block.

       Call the  SolveModel() routine with  V-h and V+h  and
       observe the difference in the value. We have to do this
       only for the variables present in the depends list of
       the corresponding modelPath.
       */

/*
       J(Xn) * (Xn+1) = - G(Xn) + J(Xn) * (Xn+1)

       |¯A1 -A2 ¯|   |¯X1 ¯|    |¯B1 ¯|
       | A2  A1  | * | X2  |  = | B2  |
        -        -    -   -      -   -
       Compute only the left half and then duplicate(?!);
*/
```

```
for(dummyBlock = getNextBlk(firstBlock);dummyBlock;dummyBlock=getNextBl
{

   for(dummyModelPaths = dummyBlock->topFuncModel->paths;dummyModelPath
        dummyModelPaths=dummyModelPaths->next)
    {
       mat_abs_row_sum(dimension,dimension,Jacobian,i,&sum);
       if( fabs(sum) < 1e-99)  fprintf(stderr,"Jacobian row sum is zer

       if(analysisType == AC)
        {
          mat_abs_row_sum(dimension,dimension,Jacobian,i+totalVariabl
          if( fabs(sum) < 1e-99)  fprintf(stderr,"Imaginary Jacobian
        }
       i++;
    }
       j = 0;
       for(dummyCircuitPath =circuitDigraph;dummyCircuitPath; dummyCir
       {
           if(dummyCircuitPath->known == TRUE ||dummyCircuitPath->ty
           if(dummyCircuitPath->blkPtr!=dummyBlock)
           {
            j++;
            continue;
           }
         mat_abs_clm_sum(dimension,dimension,Jacobian,j,&sum);
         if( fabs(sum) < 1e-99)    fprintf(stderr,"Jacobian Column is
         if(analysisType == AC)
          {
           mat_abs_clm_sum(dimension,dimension,Jacobian,j+totalVaria
          if( fabs(sum) < 1e-99)    fprintf(stderr,"Jacobian Imaginar
          }
         j++;  /* increment clm number */
       }

      for (group = firstGroup; group != NULL; group = group->next)
         {
           if(group->known == TRUE || (!strcmp(group->groupName,"GN
           if(isGroupBlockConnected(group,dummyBlock)== FALSE)
           {
            j++;
            continue;
           }
          mat_abs_clm_sum(dimension,dimension,Jacobian,j,&sum);
          if( fabs(sum) < 1e-99) fprintf(stderr,"Jacobian column co
         if(analysisType == AC)
          {
           mat_abs_clm_sum(dimension,dimension,Jacobian,j+totalVari
          if( fabs(sum) < 1e-99) fprintf(stderr,"Jacobian Imaginary
         }

          j++; /* increment clm number */
      }

      for(dummyCircuitPath =circuitDigraph;dummyCircuitPath; dummyCi
      {
          if(dummyCircuitPath->known == TRUE ||dummyCircuitPath->ty
           if(dummyCircuitPath->blkPtr!=dummyBlock)
           {
            j++;
            continue;
           }
         mat_abs_clm_sum(dimension,dimension,Jacobian,j,&sum);
         if( fabs(sum) < 1e-99)    fprintf(stderr,"Jacobian Column c
         if(analysisType == AC)
          {
           mat_abs_clm_sum(dimension,dimension,Jacobian,j+totalVari
           if( fabs(sum) < 1e-99)    fprintf(stderr,"Jacobian Imagin
          }
         j++;  /* increment clm number */
      }
   }
}
/*-------------------------------------------------------------------------*/
int computeJacobian(double *Jacobian)
{
   /* compute first KCL equations */
   /* do with each seruce in diagraph, for all the KCLs. */
   int i=0;
   int j=0;
   Complex output1;
   Complex output2;
   Complex number;
   double  diffrpart;
   double  diffipart;
   double  dervrpart;
   double  dervipart;
   GroupDef     *group;
   CircuitPaths *dummyCircuitPath;
   ModelPaths   *dummyModelPaths;
   BlockDef     *blkPtr;
   BlockDef     *dummyBlock;
   Complex      output;
   Complex      temp;
   int  k = 0;
   CircuitPaths *path = NULL;

   if(debugFlag) fprintf(stderr,"Forming KCL part of  Jacobian ...\n");

   for(i=0;i<totalKCLeqns;i++)
             ...hange the values by delta */

            ...up->value.rpart -= 2*DELTA;
            if(analysisType == AC)    group->value.ipart -2*DELTA;
            solveMastModel(dummyBlock, dummyModelPaths,&output2);
            */

            /* find the difference. Divide it by 2*DELTA, gives der
            com_sub(output1.rpart,output1.ipart,output2.rpart,outpu
            if(analysisType == AC)    com_div(diffrpart,diffipart,DE

            /* restore the value */
            group->value.rpart =    temp.rpart ;
            group->value.ipart =    temp.ipart ;

            if(debugFlag) fprintf(stderr,"Diff %lf  %lf\n",diffrpar
             if(debugFlag)  fprintf(stderr,"Derv %lf  %lf\n",dervrp

            fillJacobian(i, j,dervrpart,dervipart,Jacobian);
            j++; /* increment clm number */
       }
       for(dummyCircuitPath =circuitDigraph;dummyCircuitPath; dummyCi
       /* diff. with each path */
       {
           if(dummyCircuitPath->known == TRUE ||dummyCircuitPath->ty
            if(dummyCircuitPath->blkPtr!=dummyBlock)
            {
             fillJacobian(i, j,0,0,Jacobian);
             j++;
             continue;
            }

             if(debugFlag) fprintf(stderr,"Differentiating with glob
             /* Save the current values in temp */
             temp.rpart = dummyCircuitPath->value.rpart;
             temp.ipart = dummyCircuitPath->value.ipart;

             /* change the values by delta */
              dummyCircuitPath->value.rpart += DELTA;
              if(analysisType == AC)    dummyCircuitPath->value.ipart
              printNodesPaths();

              solveMastModel(dummyBlock, dummyModelPaths,&output1);
```

```
for(dummyBlock = getNextBlk(firstBlock);dummyBlock;dummyBlock=getNextBlk(dumm
{

  for(dummyModelPaths = dummyBlock->topFuncModel->paths;dummyModelPaths!=NUL
      dummyModelPaths=dummyModelPaths->next)
   {
     if(debugFlag) fprintf(stderr,"****************\n");
     if(debugFlag) fprintf(stderr,"Doing for  block %s : Path %s -> %s\n",d
      j=0; /* reset the clm number */
     if(debugFlag) fprintf(stderr,"Forming diff current part of Jacobian.\

     printNodesPaths();
     solveMastModel(dummyBlock, dummyModelPaths,&output2);

     for(dummyCircuitPath =circuitDigraph;dummyCircuitPath; dummyCircuitPa
     /* diff. with each path */
      {
           if(dummyCircuitPath->known == TRUE ||dummyCircuitPath->type !=
           if(dummyCircuitPath->blkPtr!=dummyBlock)
            {
            fillJacobian(i, j,0,0,Jacobian);
            j++;
            continue;
           }

            if(debugFlag)fprintf(stderr,"Differentiating with path %s -> %
            /* Save the current values in temp */
            temp.rpart = dummyCircuitPath->value.rpart;
            temp.ipart = dummyCircuitPath->value.ipart;

            /* change the values by delta */
             dummyCircuitPath->value.rpart += DELTA;
             if(analysisType == AC)    dummyCircuitPath->value.ipart += DEL
             printNodesPaths();
             solveMastModel(dummyBlock, dummyModelPaths,&output1);

            /* change the values by delta */
            /*
             dummyCircuitPath->value.rpart -= 2*DELTA;
             if(analysisType == AC)    dummyCircuitPath->value.ipart -= 2*D
             solveMastModel(dummyBlock, dummyModelPaths,&output2);
            */

            /* find the difference. Divide it by 2*DELTA, gives derivative
            com_sub(output1.rpart,output1.ipart,output2.rpart,output2.ipar

            if(analysisType == AC)    com_div(diffrpart,diffipart,DELTA,DEL
            /* restore the value */
            dummyCircuitPath->value.rpart = temp.rpart ;
            dummyCircuitPath->value.ipart = temp.ipart ;

            if(debugFlag) fprintf(stderr,"Diff %lf  %lf\n",diffrpart,diffi
            if(debugFlag) fprintf(stderr,"Derv %lf  %lf\n",dervrpart,dervi

            fillJacobian(i, j,dervrpart,dervipart,Jacobian);
            j++;  /* increment clm number */
      }
      /* diff. with each group */
     for (group = firstGroup; group != NULL; group = group->next)
        {
           if(group->known == TRUE || (!strcmp(group->groupName,"GND"))  )
           if(isGroupBlockConnected(group,dummyBlock)== FALSE)
            {
            fillJacobian(i, j,0,0,Jacobian);
            j++;
            continue;
           }
           if(debugFlag) fprintf(stderr,"Differentiating with group %s\n",
          /* Save the current values in temp */
            temp.rpart = group->value.rpart;
            temp.ipart = group->value.ipart;

            /* change the values by delta */
             group->value.rpart += DELTA;
             if(analysisType == AC)     group->value.ipart += DELTA; else
             printNodesPaths();

             solveMastModel(dummyBlock, dummyModelPaths,&output1);

{
 int i;
 float tmp = 0;
    for(i = 0; i < size ;i++) {
     if ( fabs(*(x1+i) - *(x2+i)) >tmp) tmp =  fabs(*(x1+i) - *(x2+i));
    }
 return(tmp);
}
/*------------------------------------------------------------------------*/
int solution()
{
double *tmp;
double *x1,*x2;

double epsilon = 0.001; /* The tolerance */
int    counter = 0;
int   ifail=1;
int trialNo=1;
int converged;
int solutionFlag = 0;
int i=0;

    if(debugFlag) fprintf(stderr,"Finding total variables ....\n");
    findTotalVariables();

    if(debugFlag) fprintf(stderr,"Generating KCL ....\n");
    genKCLmatrix();

    if(debugFlag) fprintf(stderr,"Finding total equations ....\n");
    findTotalEquations();

    if(debugFlag) fprintf(stderr,"Finding total values set ....\n");
    findTotalValuesToSet();

    if(debugFlag) fprintf(stderr,"Finding distances for heuristics ....\n");
    findDistance();

    if(debugFlag) fprintf(stderr,"Allocating memory for NR method...\n");
    totalVariables -=  totalValuesToSet;
    if(analysisType == AC ) dimension = 2 * (totalVariables);
    else  dimension = ( totalVariables );


    mat_calloc(dimension,dimension,&Jacobian);
    mat_calloc(dimension,1,&tmp);
    mat_calloc(dimension,1,&x1);
    mat_calloc(dimension,1,&x2);

    /* Allocate Gmatrix */
    mat_calloc(dimension,1,&Gmatrix);
    if(debugFlag) fprintf(stderr,"Allocation of memory done.\n");

   while(TRUE)
   {
      counter = 0;

      if(setValuesHeuristically(trialNo) == 0)
      {
         trialNo ++;
         mat_init(dimension,dimension,Jacobian);
         mat_init(dimension,1,tmp);
         mat_init(dimension,1,x1);
         mat_init(dimension,1,x2);
      }else
       {
         converged = FALSE;
         break;  /* Couldn't go ahead, breaking the outer loop. */
       }

      /*  J(Xn) * (Xn+1) = - G(Xn) + J(Xn) * (Xn)   */
```

```
            /* change the values by delta */
            /*
             dummyCircuitPath->value.rpart -= 2*DELTA;
             if(analysisType == AC)    dummyCircuitPath->value.ipart
             solveMastModel(dummyBlock, dummyModelPaths,&output2);
            */

            /* find the difference. Divide it by 2*DELTA, gives der:
            com_sub(output1.rpart,output1.ipart,output2.rpart,outpu

            if(analysisType == AC)    com_div(diffrpart,diffipart,DE
            /* restore the value */
            dummyCircuitPath->value.rpart = temp.rpart ;
            dummyCircuitPath->value.ipart = temp.ipart ;

            if(debugFlag) fprintf(stderr,"Diff %lf  %lf\n",diffrpar
            if(debugFlag) fprintf(stderr,"Derv %lf  %lf\n",dervrpar

            fillJacobian(i, j,dervrpart,dervipart,Jacobian);
            j++;  /* increment clm number */

        }
        i++;  /* increment row number */
        if(debugFlag) fprintf(stderr,"CHECK POINT. Formed Jacobian row
     }
  }
  if(debugFlag) fprintf(stderr,"CHECK POINT. Jacobian dimension = %d  x
}
/*---------------------------------------------------------------------
/* copies values to the path and node datastructures */
int copyValuesToDS(double *x)
{
 GroupDef       *group = NULL;
 CircuitPaths  *dummyCircuitPath = NULL;
 int i=0;
 if(debugFlag) fprintf(stderr,"Copying values to DS...\n");
 if(debugFlag) fprintf(stderr,"Copying to circuit paths DS...\n");
         for(dummyCircuitPath =circuitDigraph;dummyCircuitPath; dummyCi
         {
               if(dummyCircuitPath->known == TRUE||dummyCircuitPath->ty
               if(debugFlag) fprintf(stderr,"Path %s -> %s \n",
                       dummyCircuitPath->startNode,
                       dummyCircuitPath->endNode);

                dummyCircuitPath->value.rpart = *(x+i);
                if(analysisType == AC) dummyCircuitPath->value.ipart =
                i++;
         }
 if(debugFlag) fprintf(stderr,"Copying to circuit paths DS done.\n");

 if(debugFlag) fprintf(stderr,"Copying to group DS...\n");
        for (group = firstGroup; group; group = group->next)
            {
               if(group->known == TRUE || (!strcmp(group->groupName,"G
               if(debugFlag) fprintf(stderr,"Group %s \n", group->grou
                group->value.rpart = *(x+i);
                 if(analysisType == AC) group->value.ipart = *(x+i+tot
                i++;
         }
 if(debugFlag) fprintf(stderr,"Copying to group DS done.\n");

 if(debugFlag) fprintf(stderr,"Copying to globals vars...\n");
         for(dummyCircuitPath =circuitDigraph;dummyCircuitPath; dummyC
         {
               if(dummyCircuitPath->known == TRUE ||dummyCircuitPath->
               if(debugFlag) fprintf(stderr,"Path %s -> %s \n",
                       dummyCircuitPath->startNode,
                       dummyCircuitPath->endNode);

                /* Save the current values in temp */
                dummyCircuitPath->value.rpart = *(x+i);
                 if(analysisType == AC)  dummyCircuitPath->value.ipart
                i+t;
         }
 if(debugFlag) fprintf(stderr,"CHECK POINT. Number of variables = %d\n",
 if(debugFlag) fprintf(stderr,"Copying to globals vars done.\n");
 if(debugFlag) fprintf(stderr,"Copying values to DS Done.\n");

}
/*---------------------------------------------------------------------
double proximity(double *x1,double *x2,int size)
                 - }
                 i      ugFlag) fprintf(stderr,"Iteration No. %d\n",counter).
                 ma _ /pe("Current Solution\n",dimension,1,x2);

                 if(counter > MAXITERATION )
                 {
                  if(debugFlag) fprintf(stderr,"Could not converge in %d it
                  mat_type("Updated solution",dimension,1,x2);
                  converged = FALSE;
                  unSetValuesHeuristically(trialNo - 1 );
                  break;  /* breaking the inner NR-loop. Try next heuristic

                 }
               if(! (proximity(x1,x2,dimension) > epsilon) )
               {
                converged = TRUE;
                if(debugFlag) fprintf(stderr,"Complete final solution = \n"
                if(debugFlag) printNodesPaths();
                if(debugFlag) fprintf(stderr,"######### CONVERGED in %d ite
                break;
               }
              }while(TRUE);
              if(converged == TRUE ) break;
              if(debugFlag) fprintf(stderr,  "********** NOT CONVERGED in %d
      }
       freeDistanceList();
       free((char *)Jacobian);
       free((char *)Gmatrix);
       free((char *)tmp);
       free((char *)x1);
       free((char *)x2);
       free((char *)KCLmatrix);
       /* debugFlag = TRUE; */
       return (!converged);  /* return zero on success */
    }
```

```
if(debugFlag) fprintf(stderr,"Initializing variables...\n");
copyValuesToDS(x1);                                     /* Initialize all c
                                                           voltages and pat
if(debugFlag) fprintf(stderr,"Initialization done.\n");

/* Set some initial diff so that proximity becomes FALSE for the first ti
mat_init(dimension,1,x2);
converged = TRUE;
      do
      {
         if(debugFlag) fprintf(stderr,"Initializing x1 ...\n");
         mat_init(dimension,1,x1) ;

         if(debugFlag) fprintf(stderr,"Adding x1 to x2 ...\n");
         mat_add(dimension,1,x1,dimension,1,x2,x1);

         if(debugFlag) fprintf(stderr,"Calling ComputeGmatrix ...\n");

         mat_init(dimension,1,Gmatrix);
         computeGmatrix(Gmatrix);                              /* co
         if(debugFlag) fprintf(stderr,"Printing G matrix.....\n");
         mat_type("G_matrix\n",dimension,1,Gmatrix);

         if(debugFlag) fprintf(stderr,"Calling ComputeJacobian ...\n");

         mat_init(dimension,dimension,Jacobian);
         computeJacobian(Jacobian);                            /* co
         if(debugFlag) fprintf(stderr,"Printing J matrix.....\n");
         mat_type("J matrix\n",dimension,dimension,Jacobian);

         if(debugFlag) fprintf(stderr,"Multiplying Gmatrix by -1: ...\n")
         mat_scalar_mult(dimension,1,-1,Gmatrix,Gmatrix);     /* multiply

         if(debugFlag) fprintf(stderr,"Multiplying  Jacobian to x1  ...\n
         mat_mult(dimension,dimension,Jacobian,dimension,1,x1,tmp);
                                                                /* c

         if(debugFlag) fprintf(stderr,"Adding two vectors ...\n");
         mat_add(dimension,1,tmp,dimension,1,Gmatrix,tmp);

         if(debugFlag) fprintf(stderr,"Calling solution routine ...\n");
         counter++;

         solutionFlag = mat_sim2(Jacobian,tmp,dimension,x2);

         if( solutionFlag )
         {
            reportJacobian(Jacobian);
            if(debugFlag) fprintf(stderr,"?(LinATG) Error : Solution no
            converged = FALSE;
            unSetValuesHeuristically(trialNo - 1 );
            break; /* breaking the inner NR-loop. Try next heuristics.
         }
         else
         {
           copyValuesToDS(x2);
/****************************************     *************************
* Description   : The deleteDesignPin routine.    ates the design pin      *
*                 structures from the                                    *
* Author(s)     : Ravidranath N.                                         *
* Called by     : main()                                                 *
* Calls         :                                                        *
* Date created  : Mon May 11 14:04:38 GMT+5:30 1992                      *
* Date Modified : Wed May 13 16:12:45 GMT+5:30 1992                      *
**************************************************************************/

/* Please see diagraph design document for the details */

#include "includes.h"
#include "NetlistFuncTypes.h"
#include "solution.h"
/*-----------------------------------------------------------------------*/
/*******************************/
/* Circuit memory manuplations */
/*******************************/
CircuitPaths *allocCircuitPath(CircuitPaths  *curCircuitPath)
{
  CircuitPaths  *tempcurCircuitPath = NULL;
  tempcurCircuitPath=(CircuitPaths *)calloc(1,sizeof(CircuitPaths));
  if (!(tempcurCircuitPath==NULL))
  {

    if(curCircuitPath==NULL)
       curCircuitPath=tempcurCircuitPath;
    else
       curCircuitPath->next=tempcurCircuitPath;
    tempcurCircuitPath->next==NULL;
    return tempcurCircuitPath;
  }
  else
  {
    fprintf(stderr,"No Memory.\nAborting.\n");
    exit_LinATG();
  }
}
/*-----------------------------------------------------------------------*/
int free_circuit_paths(CircuitPaths *circuitPaths)
{

  if(circuitPaths != NULL)
  {
   deleteString(circuitPaths->startNode);
   deleteString(circuitPaths->endNode);
   free(circuitPaths);
  }
}
/*-----------------------------------------------------------------------*/
int freeCircuitPathList()
{
 CircuitPaths *prevCircuitPath;
 CircuitPaths *dummyCircuitPath;
 extern CircuitPaths *circuitDigraph;
 dummyCircuitPath = circuitDigraph; /* the first pointer of Circuit Diagraph */
 while(dummyCircuitPath != NULL)
 {
   prevCircuitPath  = dummyCircuitPath;
   dummyCircuitPath = dummyCircuitPath -> next;
   /* free all the elements in the the prevCircuitPath */
   free_circuit_paths(prevCircuitPath);
 }
}

/*-----------------------------------------------------------------------*/
int free_model_paths(ModelPaths *modelPaths)
{

  if(modelPaths != NULL)
  {
   deleteString(modelPaths->startNode);
   deleteString(modelPaths->endNode);
   free(modelPaths);
  }
}
/*-----------------------------------------------------------------------*/
int freeModelPathList(ModelPaths *firstModelPath)
{
 ModelPaths *prevModelPath;
 ModelPaths *dummyModelPath;
 dummyModelPath = firstModelPath;
 while(dummyModelPath != NULL)
 {
   prevModelPath  = dummyModelPath;
   dummyModelPath = dummyModelPath -> next;
   /* free all the elements in the the prevModelPath */
   free_model_paths(prevModelPath);
 }
}

/*-----------------------------------------------------------------------*/
```

```
      }
       printf("***.  *******************************\n");

   }
   /*-----------------------------------------------------------------------
   /*
    Generate the circuit paths of the circuit if given the model paths
    for each of the model.
    This is a main routine of the Circuit Graph Generation Module.
   */
   int circuitGraph()
   {
     BlockDef          *dummyBlock = NULL;
     CircuitPaths      *currentCircuitPath = NULL;
     ModelPaths        *dummyModelPaths    = NULL;
     TopFuncModel      *modelPointer       = NULL;
     circuitDigraph = NULL;

     if(debugFlag) fprintf(stderr,"Entering Diagraph Module.\n");
     if(debugFlag) fprintf(stderr,"Top Block is not parsed.\n");
     for(dummyBlock = getNextBlk(firstBlock);dummyBlock;dummyBlock=getNext:
     {                                    /* COMMENTED OUT BY Nanda - 30/6/92
      /* if(mastCallModel(dummyBlock,&modelPointer))
        {
          fprintf(stderr," Error : Couldnot parse the %s MAST model.", dum
          fprintf(stderr,"Aborting . . .\n");
          exit_LinATG();
        }  */
        for(dummyModelPaths = dummyBlock->topFuncModel->paths;dummyModelPa
            dummyModelPaths=dummyModelPaths->next)
        {
          /*  create a new path  */
          currentCircuitPath=allocCircuitPath(currentCircuitPath);
          if( circuitDigraph == NULL)
           {
             circuitDigraph  = currentCircuitPath;
           }
           /* This is the latest and at the end so next is NULL */
           /* write into the structure */
           if(dummyModelPaths -> type == SOURCE )  {  /* Added  by Nanda -
              currentCircuitPath->startNode = copyString(getGroupName(dum
              if(strcmp(dummyModelPaths->endNode,"GND") == 0)
              {
                 currentCircuitPath->endNode   = copyString("GND");
              }
              else
              {
                 currentCircuitPath->endNode   = copyString(getGroupName(
              }
           }
           else{
              currentCircuitPath->startNode = copyString(dummyModelPaths-:
              currentCircuitPath->endNode = copyString("---");
           }
           currentCircuitPath->type       = dummyModelPaths -> type;
           currentCircuitPath->blkPtr     = dummyBlock;
           /* block pointer is preserved in the circuit path structure -R
           /*
              Similarly,  do  for  all  the  depending  sources  linked 1
              written, since it can be understood easily. It is just like
              the  copy  of the model path data structure of that block, :
              the name from the net list groups (nodes).
           */

        }
      /* free memory of the model
      freeModelPathList(modelPointer->paths);
      fprintf(stderr,"Memory freed for model path.\n"); */
     }
     printcircuitDigraph();
     /* Free circuit Graph    */
     /* freeCircuitPathList();
       fprintf(stderr,"Memory freed for circuit path.\n");
     */
     if(debugFlag)  fprintf(stderr,"Exiting Diagraph Module.\n");

   }  /* End of circuitGraph() */
   /*-----------------------------------------------------------------------
```

```
int printcircuitDigraph()
{
  CircuitPaths    *currentCircuitPath = NULL;
  extern CircuitPaths *circuitDigraph;
  if(debugFlag)
  {
      fprintf(stderr,"\n\n\n********** Circuit Graph **********\n");
      for(currentCircuitPath = circuitDigraph;currentCircuitPath!=NULL;
         currentCircuitPath=currentCircuitPath->next)
     {
      fprintf(stderr,"Starting Node : %-10s  Ending Node : %-10s Depends Type
                  currentCircuitPath->startNode,
                  currentCircuitPath->endNode,
                  currentCircuitPath->type,
                  currentCircuitPath->blkPtr->instName);
     }
      fprintf(stderr,"***********************************\n");
  }

}
/*--------------------------------------------------------------------------*/
int printModelDiagraph(TopFuncModel  *topModelPointer)
{
  ModelPaths    *currentModelPath = NULL;

      printf("********** Model Graph **********\n");
      for(currentModelPath = topModelPointer->paths;currentModelPath!=NULL;
         currentModelPath=currentModelPath->next)
     {
      printf("Start Node : %s, End Node : %s, Type of the Device : %d \n",
                  currentModelPath->startNode,
                  currentModelPath->endNode,
                  currentModelPath->type);
/****************************************    *************************
* Description   : The deleteDesignPin routine.    .tes the design pin    *
*                 structures from the                                   *
* Author(s)     : Ravidranath N.                                        *
* Called by     : main()                                                *
* Calls         :                                                       *
* Date created  : Mon May 11 14:04:38 GMT+5:30 1992                     *
* Date Modified : Mon May 11 14:04:38 GMT+5:30 1992                     *
*************************************************************************/


/* FOR ALL DETAILS OF IMPLEMENTATION,  SET VALUE HEURISTICS DESIGN MODULE */


#include "includes.h"
#include "NetlistFuncTypes.h"
#include "linatgMath.h"
#include <math.h>

int dystra(int *d,int n,int s,int t,int *labelt)
{

#define DYSTRA_MAX_DISTANCE      99999

      int *label;
      int z;
      int *vect;
      int l;
      int i;
      int m;
      int p;
      int j;

    if( s == t) {*labelt = 0; return 0;}
    mat_calloc_int(n,1,&label);
    mat_calloc_int(n,1,&vect );


    for(l=0;l<n;l++)
    {
       *(label + l) = DYSTRA_MAX_DISTANCE;
       *(vect  + l) = 0;
    }

     *(label + s) = 0;
     *(vect  + s) = 1;

     i = s;

do{
     m = DYSTRA_MAX_DISTANCE;
     for(j=0; j < n; j++)
     {
        if( *(vect + j) == 1) continue;
        z = *(d + i +  j * n) + *(label + i);
        if(z < *(label+j)) *(label+j) = z;
        if( *(label+j) > m) continue;
        m = *(label+j);
        p = j;
     }

     *(vect + p) = 1;
     i = p;
/*    printf("p=%d t=%d.\n",p,t); */
   }
  while ( p != t);
  *labelt = *(label + t);

  free(label);
  free(vect );
  return 0;
}

/*--------------------------------------------------------------------------*/
/* Creates a matrix such that :

        D = [d (i,j) ]  where
                      0
        d(i,j) = Complexity of the block through which groups
                 i and j are connected.

        d(i,i) = 0;

        d(i,j) = infinity, (or a very very large number).
*/

int createWeightedD()
{
  PinDef *pinPtrJ=NULL,*pinPtrI = NULL;
  GroupDef *group;
  BlockDef *dummyBlock;
  int i=0,j=0;


  /* find_total_number of groups */
  totalGroups = 0;
  for (group = firstGroup; group != NULL; group = group->next)
  {
     totalGroups++;
  }

#ifdef DEBUG_HEURISTICS
  fprintf(stderr,"Total Groups : %d\n", totalGroups);
#endif
   /*  Allocate memory for D matrix  */
   mat_calloc_int(totalGroups,totalGroups,&d_matrix);
   /*  Fill all the elements with large numbers */
   for(i=0;i<totalGroups*totalGroups;i++)
   {
     *( d_matrix + i) =  DYSTRA_MAX_DISTANCE;
   }
   /* mat_type_int("This is initialized d_matrix",totalGroups,totalGroups,d_mat

  /* Do with each block.*/
  for(dummyBlock = getNextBlk(firstBlock);dummyBlock!=NULL;dummyBlock = getNext
  {
     /*
     Complexity    lock can be taken as number of pins that block
     has, which    stored in the BlkDef data-structure or it can be
     as specifie. .y the user as a PD (Propagation Difficulty) value.
    */

         for (pinPtrI = dummyBlock->pins; pinPtrI; pinPtrI = pinPtrI->ne
         {
         for (pinPtrJ = dummyBlock->pins; pinPtrJ; pinPtrJ = pinPtrJ->ne
             {
              i=getGroupNumber(dummyBlock,pinPtrI);
              j=getGroupNumber(dummyBlock,pinPtrJ);
              if( i == j)
              {
                 *(d_matrix + i + j * totalGroups)  = 0;
              }
              else
              {
                if( (*(d_matrix + i + j * totalGroups)) > dummyBlock -> r
                {
                  *(d_matrix + i + j * totalGroups)  =  dummyBlock -> no(
/*
                  fprintf(stderr,"Block Name -> %s, Pins -> %d\n",dummyB:
*/
                }
              }
         }
         }
   }
#ifdef DEBUG_HEURISTICS
      mat_type_int("This is first content D matrix",totalGroups,totalGrou;
#endif
      dummyBlock = blkUnderTest ;
         for (pinPtrI = dummyBlock->pins; pinPtrI; pinPtrI = pinPtrI->ne
         {
         for (pinPtrJ = dummyBlock->pins; pinPtrJ; pinPtrJ = pinPtrJ->ne
            {
            i=getGroupNumber(dummyBlock,pinPtrI);
            j=getGroupNumber(dummyBlock,pinPtrJ);
            *(d_matrix + i + j * totalGroups)  = 1;/* Changed Tue Jul 28 :
         }
      }

/*
      mat_type_int("This is re-constructed D matrix",totalGroups,totalGro
*/
}
/*--------------------------------------------------------------------------
Distance *allocDistance(Distance  *curdistance)
{
  Distance  *tempcurdistance = NULL;
  tempcurdistance=(Distance *)malloc(sizeof(Distance));

  if (!(tempcurdistance==NULL))
  {

    if(curdistance==NULL)
       curdistance=tempcurdistance;
    else
       curdistance->next=tempcurdistance;

/*
    fprintf(stderr,"Memory Allocation Done\n");
*/
    tempcurdistance->next=NULL;
    return tempcurdistance;

  }
  else
  {
    fprintf(stderr,"No Memory.\nAborting.\n");
    exit_LinATG();
  }
}

/*--------------------------------------------------------------------------
int printDistanceList()
{
    Distance *currDistance;
 if(debugFlag)
 {
   fprintf(stderr,"****** DISTANCE LIST *****\n");
   fprintf(stderr,"  Group No.      Distance\n" );
   for (currDistance = firstDistance; currDistance; currDistance = curr
   {
          fprintf(stderr,"      %-10d%-15d%\n", currDistance->groupNumb
   }
   fprintf(stderr,"************************\n\n");
 }

}

/*--------------------------------------------------------------------------
int freeDistanceList()
{
 Distance *prevDistance;
 Distance *dummyDistance;
 dummyDistance = firstDistance;
 while(dummyDistance != NULL)
 {
   prevDistance  = dummyDistance;
   dummyDistance = dummyDistance -> next;
   free(prevDistance);
 }
}
/*--------------------------------------------------------------------------
int distanceCompare(Distance **i,Distance **j)
{
/*
       fprintf(stderr, "In compare Distance %d %d \n",  (*i)->distance,
*/
       return( - ( (*i)->distance -  (*j)->distance)  ) ;
}

/*--------------------------------------------------------------------------
int sortDistanceList()
{
```

```
 Do with each pair of the pins of the block.
 and get the group numbers for set of of the pin, from
 getGroupNumber() routine, by calling  twice, i.e. once for
 each pin. Giving i and j.
 */

/*
 Write the  complexity of the block at (i,j),
 if it is less than the number (i,j)
 which already exists.

 {
   total_elements++;
 }

/*
 fprintf(stderr,"Total No. of Elements %d \n", total_elements);
*/

 if(total_elements == 0) {return 0;}
 /*  fprintf(stderr,"Sorting ... \n"); */
 /* allocate memory for storing the pointers of these elements */.
 distanceArray=(Distance **)malloc(total_elements * sizeof(Distance *));
 if(!distanceArray)
 {
   fprintf(stderr,"Insufficient memory.\n Aborting . . .\n");
  exit_LinATC();
 }
 /* store the pointers */
 currDistance = firstDistance;
 for (i = 0; i<total_elements;i++)
 {
     distanceArray[i] = currDistance;
     currDistance = currDistance->next;
 }
/*
 for(i=0;i<total_elements;i++)
 {
   fprintf(stderr,"Pre Sort -> %d\n", *distanceArray[i] -> distance);
 }
*/
 /* Sort the pointers */
 qsort((char *)distanceArray,total_elements,sizeof(Distance *),distanceCompare
/*
 for(i=0;i<total_elements;i++)
 {
   printf("Post Sort -> %d\n",*distanceArray[i] -> distance);
 }
*/
 /* Put back the pointers in a linked list */
 firstDistance   = distanceArray[0];
 for(i=0;i<total_elements;i++)
 {
 currDistance = distanceArray[i];
 if(i == (total_elements - 1) )
   currDistance -> next = NULL;
 else
   currDistance -> next = distanceArray [i + 1];
 }
 free(distanceArray);
 return 0;
}
/*------------------------------------------------------------------------*/
static int distanceGroupExists(int groupNumber)
{
   Distance *currDistance;
   for (currDistance = firstDistance; currDistance; currDistance = currDistance
   {
      if( currDistance->groupNumber == groupNumber) return 0;
   }
   return 1;
}
/*------------------------------------------------------------------------*/
/*
 Generate the circuit paths of the circuit if given the model paths
 for each of the model.
 This is a main routine of the Circuit Graph Generation Module.
*/
int findDistance()
{
    GroupDef *group  = NULL;
    PinDef   *pinPtr = NULL;
    BlockDef *dummyBlock = NULL;
    int shortDistance = 0;
    Distance *currentDistance = NULL;

    int i = 0, j = 0;
    /* Form the weighted D matrix */
    createWeightedD();
    /*
     Do with ANY ONE pin (hence any group to which the block is connected)
     of the block under test
    */
    i = getGroupNumber(blkUnderTest,blkUnderTest->pins);

    /*
     Do with the all the pins of the TOP block (firstBlock in the linked list)
     which are NOT set and which are NOT digital.
    */
   firstDistance = NULL;
   for(dummyBlock = getNextBlk(firstBlock);dummyBlock!=NULL;dummyBlock = getNext
   {
/*      if(dummyBlock == blkUnderTest)continue; */ /* Commented Tue Jul 28 18:36
         for (pinPtr = dummyBlock->pins; pinPtr; pinPtr = pinPtr->next)
         {
            if( !(
               (pinPtr->status == CTRL)              ||
               (pinPtr->status == POWER)             ||
               (strcmp(pinPtr->pinName,"GND") == 0)
             )
          )
        {
           if(pinPtr->designIO == TRUE)
           {
              group = getGroupPointer(dummyBlock,pinPtr);
              if(group->known == TRUE || group->direction == OUTPUT) continue;
              j = getGroupNumber(dummyBlock,pinPtr);
           }
           else
           {
             continue;
           }
        }
        else
        {
             continue;
        }
        /* call shortest distance, with the block under test group */
/*
        fprintf(stderr,"totalGroups = %d, i = %d , j is %d, Init Short D is %d\

        mat_type_int("This is re-re-constructed D matrix",totalGroups,totalGrou
*/
        dystra(d_matrix,totalGroups,i,j, &shortDistance);
/*
        fprintf(stderr,"Distance between %d and %d is %d  \n",i,j,shortDistance
*/

 /*

  Called by       : main()
  Author          : Nandakumar G.N.
  Date Created    : 09 June 1992
  Date Modified   : 25 Jan 1993

  Description     :This routine generates a matrix of KCL equations.
     Inputs.
     -------
        Circuit Graph (digraph).
        Example :-
         Complete digraph of the OP-AMP feedback amplifier, will be as shown be
```

```
Distance *currDistance;
int total_elements = 0;
int i = 0;
Distance **distanceArray = NULL;

/* find total number of elements in the linked list */
if(firstDistance == NULL) return 0;

total_elements = 0;
for (currDistance = firstDistance; currDistance; currDistance = currI
        /** cop    : distance and the TOP block design IO pin name in
            Dist     data-structure.  If distance is zero don't include
            it in  _e linked list.
        **/

        if( (shortDistance != 0) && (distanceGroupExists(j) != 0) )
        {
           currentDistance=allocDistance(currentDistance);
           if(  firstDistance == NULL)
           {
              firstDistance  = currentDistance;
           }
           currentDistance->groupNumber = j;
           currentDistance->distance    = shortDistance;
           currentDistance->next        = NULL;
/*

          fprintf(stderr,"Test : %d %d\n",currentDistance->groupNumber, 
*/
        }
     }
  }
  sortDistanceList();
  printDistanceList();
  free(d_matrix);
}  /* End of findDistance() */
/*------------------------------------------------------------------------
```

```
   extern   int   t.    Cleqns;
   extern   int   to   /aths;
            int   count = 0;
      totalKCLeqns = 0;
      /* First find total KCL equations */
      for(group = firstGroup;group;group = group->next) {
           /* groups corresponding to input designIOs
              are not included */

          if(group->designIO == TRUE && group->direction != OUTPUT)
           {
             continue;
```

```
              CIRCUIT                                      DIGRAPH

                      RES3                                  /--------------
              +-----^^^^^^^-----+                           |
              |                 |                           3|
              |  |\             |               1 o---------o------\
        RES1  |  | \            |                                   \    /--
  1 o---^^^^^-+--|- \           |                          4         \  /
              3  |   \__________+------o 5      2 o---------o-----\   | /
        RES2     |   /                                             \  | |
  2 o---^^^^^----|+ /|                                              \ | |
              4  | / |     OPAMP                                     \|/
                 |/  |                                               o  0
                     V 0
```

In above digraph, for the overall circuit, node '0' is taken as the r
ANY node can be taken as reference, while constructing the circuit di Following datastructure is used to store the circuit graph.

```
struct CircuitPaths
{
  char  *startNode;        { Starting Node }
  char  *endNode;          { Ending Node   }
  struct CircuitDepends *depends;
  struct CircuitPaths   *next;
}

 / Node names on which the controlled source
  (Voltage or Current Source) value depends./

 struct CircuitDepends
  {
    char type;             /Voltage source or Current source/
    union
    {
      struct Voltage
          {
            char *node;     / starting node name/
          }
      struct Current
          {
            char *fromNode;
            char *toNode;
          }
    }
    struct CircuitPath *next;
  }


Output.
-------
 A link list of KCL equations.

Data Structure generated by KCL routine .
-----------------------------------------
KCL eqns are stored in the form of link list

    If KCL[i,j] = 1  --> there is a  current flowing
                         from node i to node j.

    If KCL[i,j] = 0  --> there is no current flow
                         between node i and  node j.

    If KCL[i,j] = -1 --> there is a current flowing
                         from node j and  node i.

Procedure
---------

   Circuit Graph is given as a list of paths (ModelPath structure)
We can assume that direction of current is from the start node to
end node.
   To generate matrix from this representation is  very easy.
We form KCL at each group ( it is nothing but a node in the Circuit
graph) exept input designIOs are included. For each path in circuit
find the start node and end not.
   KCL[P1,P2] = 1 and  KCL[P2,P1] = -1.

Each row Corresponding to a KCL equation.

example .        Paths (edges in the circuit graph)
                |-------------------------------|
      nodes     |   | 1   2   3   4   5   6 |
        |       |---|---------------------------|
        V       | 1 | 0   1  -1   0   0   1 |
                |---|---------------------------|
                | 2 |                           |

        i(1->2) - i(1->3) + i(1->6)  = 0 .

*/
#include <math.h>
#include "includes.h"
#include "NetlistFuncTypes.h"
#include "PropFuncTypes.h"
#include "UtilFuncTypes.h"
#include "ModelFuncTypes.h"
#include "Functionality.h"
#include "linatgMath.h"
/*-----------------------------------------------------------------------*/
void genKCLmatrix()
{
CircuitPaths    *path = NULL;
Int             grp1,grp2;
Int             pathCount ;
GroupDef        *group;
GroupDef        *group1;
GroupDef        *group2;

/*
 Called by       : solution()
 Author          : Nandakumar G.N.
 Date Created    : 09 June 1992
 Date Modified   : 25 Jan  1993

 Description .
      This routine is called from Newton-Raphson ( solution.c ) routine
  to update G matrix and the jacobian J during each iteration which is
  explained in design document.

  Inputs

   Inputs to this routine are
      1) Pointer to the BlockDef structure of the block.
      2) Source name. ( A single block may be modelled with more than one
                        source).

  Output

   This routine outputs a complex number.In DC tests imaginary part will
   be zero. MAST parser routine parses the MAST model for the block and
   store the whole model unsing follwing data structures.


    / Top level structure used in funcModel /
  struct FuncModelDef {
        ModelPath       *paths;
        SymTab          *symTable;
        Sections        *sections;
  }

  struct Sections {
        Int              section;  / PARAM,WHEN,VALUE,EQN /
        StmtDef         *stmtPtr;
        Sections        *next;
  }
```

```
        totalKCLeqns++;
    }

    if (totalKCLeqns == 0)
    {
      KCLmatrix = NULL; return;
    };

    mat_calloc_int(totalKCLeqns,totalPaths+1,&KCLmatrix);
    for(group = firstGroup;group;group = group->next) {
        /* groups corresponding to input designIOs
           are not included */
       if((group->designIO == TRUE && group->direction != OUTPUT) || (is
        {
         if(debugFlag) fprintf(stderr,"Not writing KCL at node %s \n",gr
          continue;
        }
       if(debugFlag)  fprintf(stderr,"Writing KCL at node %s \n",group->
       count++;
       pathCount = 0;
       for(path =circuitDigraph;path;path =path->next){
         /*
            if(path->type == SOURCE && path->known != TRUE){  Changed We
             as to include the known paths also in KCL matrix.
          */
          if(path->type == SOURCE){
              pathCount++;
              if((strcmp(group->groupName,path->startNode) == 0)||
                   (strcmp(group->groupName,path->endNode) == 0)) {

                 grp1 = getGrpNum(path->startNode);
                 grp2 = getGrpNum(path->endNode);

                 group1 =  getGroupPointerFromNumber(grp1);
                 group2 =  getGroupPointerFromNumber(grp2);


                 if(group1 == group)
                     *( KCLmatrix + (pathCount - 1) * totalKCLeqns + (cou
                 else
                 if(group2 == group)
                     *( KCLmatrix + (pathCount - 1) * totalKCLeqns + (cou
              }

          }
       }
       *( KCLmatrix + (pathCount) * totalKCLeqns + (count - 1) ) = grou
    }
    mat_type_int("This is system KCL matrix",totalKCLeqns,totalPaths+1,KC
}/* End of genKCLmatrix */
/*------------------------------------------------------------------------
```

```
     step 9) Go t   e equation corresponding to the source.

     step10) Eval.   e rhs an lhs of the expression exp1 = exp2 seperatel
             and get the differance exp1 - exp2.

     step11) Return the value.

*/

#include <math.h>
#include "includes.h"
#include "NetlistFuncTypes.h"
#include "PropFuncTypes.h"
#include "UtilFuncTypes.h"
#include "ModelFuncTypes.h"
#include "Functionality.h"

int solveMastModel(blk_ptr,source,outPut)
BlockDef     *blk_ptr;
ModelSource  *source;
Complex      *outPut;

{
FuncModel      *section;
SymTab         *tmpSymTab;
TopFuncModel   *topFunc;
PinDef         *tmp;
GroupDef       *group;
ModelPaths     *path;
CircuitPaths   *cpath;
char           token[50];
Complex        *val;
  if(debugFlag) {
    fprintf(stderr,"SolveMastModel is called \n");
    fprintf(stderr,"%s is (%s   %s)\n",(source->type == SOURCE)?"SOURCE":
                 source->startNode,(source->type == SOURCE)?source->endNo
  }
```

```
/ General structure of a statement /
struct StatementDef {
      Int            condFlag;    / TRUE or FALSE /
      LinString      cond;
      StmtDef*       ifTrue;
      StmtDef*       ifFalse;
      Expression     expr;
      StmtDef*       next;
}

union  ExpDef {
        OrdExp*    ordexp;
        CurrStmt*  currstmt;
}

struct OrdExpDef {
       LinString      lhs ;        / Left hand side of the expression   /
       LinString      rhs ;        / Right hand side of the expression  /
}

struct CurrStmtDef {
         Int            condFlag;  /  This flag is true if the eqn is i: vout
                                   /  and false when eqn is i(IN->OUT) += ...
         char           *source    /  name of the source      /
         CondStmt*      condStmt;  /  This will be NULL if condFlag is FALSE
         CurrExp*       currexp;   /  This will be NULL if condFlag is TRUE
         CurrStmt*      next;
}

struct CurrExpDef {
       LinString      pin1;       / Pin1 referred in the current eqn    /
       LinString      pin2;       / Pin2 referred in the current eqn    /
       Int            direction;  / PLUS or MINUS                       /
       OrdExp*        expr;
}

struct CondStmtDef {
         LinString      tag;
         OrdExp*        expr;
}

struct FuncModelPinsDef {
 int                type; / ELECTRICAL or LOGIC_4 /
 char              *name;
 FuncModelPins     *next;
}

/ Symbol Table structure /
struct SymTable {
      LinString        type;
                / valv,vali,vari,varv,number,etc etc/
      LinString        name;
      Int              set;
      Int              expFlag;
      union {
          LinString    expr;
          Complex      val;
      } value;
      SymTab*          next;
}

struct Complex {
       double    rPart;
       double    iPart;
}
```

Procedure step 1) First construct the symbol table by parsing the header information and variable declarations given in the MAST model. Data structure is given above.

step 2) Go through each section of the model (PARAMETER,VALUE ,EQUATIONS).

step 3) If section is PARAM go to step 5 .

step 4) If section is VALUES go to step 5 else go to step 9.

step 5) If the statement is conditional statement,evaluate the condition and if it is true go to ifTrue part of the statement else go to ifFalse section under the statement.

step 6) If it is not a conditonal expression, evalutate right hand side of the expression and assign the value to the variable appearing in the left side and update the symbol Table.

step 8) Go to step 4

```
StmtDef       *stmt;
BlockDef      *blk_ptr;
SymTab        *tmpSymTab;
{
LinString       temp_cond;
LinString       tmpString;
Int             flag;
Complex         value;

   if(stmt->condFlag == TRUE){
      if(debugFlag)
         fprintf(stderr,"Condition is = %s\n",stmt->cond);

      /* First modify condition by substituting values from symTable */
      temp_cond = copyString(modifyExp(blk_ptr,tmpSymTab,stmt->cond));
      if(debugFlag)
         fprintf(stderr,"Modified Cond = %s\n",temp_cond);

      if(temp_cond == NULL)
         return (FALSE);

      flag = evalcond(temp_cond) ;/* Solve the condition */
      deleteString(temp_cond);

      if(flag){
         /*  go to True section of the conditional stmt */
        if(evaluateStmt(stmt->ifTrue,blk_ptr,tmpSymTab) == FALSE)
            return(FALSE);
        else
            return(TRUE);
      }
      else {
         /*  go to False section of the conditional stmt */
        if( evaluateStmt(stmt->ifFalse,blk_ptr,tmpSymTab) == FALSE)
            return(FALSE);
        else
            return(TRUE);
      }
   }
   else
   if(stmt->expr.ordexp){
      /*  stmt is an expression */
      if(debugFlag)
         fprintf(stderr,"Expression is %s = %s\n",stmt->expr.ordexp->lhs,
                                         stmt->expr.ordexp->rhs);
      tmpString = copyString(modifyExp(blk_ptr,tmpSymTab,stmt->expr.ordexp->rhs

      if(debugFlag)
         fprintf(stderr,"Modified RHS = %s\n",tmpString);

      if(tmpString == NULL)
               return (FALSE);

      calculate(tmpString,&value);/* Call calculate routine */
      deleteString(tmpString);

      if(debugFlag)
         fprintf(stderr,"Value = %f +i %f\n",value.rpart,value.ipart);
      updateST(tmpSymTab,stmt->expr.ordexp->lhs,&value,VAL);
                               /* update symbol table */
```

```
if(debugflag) {
    fprintf(stderr,"***************************************************
    fprintf(stderr,"Block  is %s\n ",blk_ptr->instName);
    for(tmp = blk_ptr->pins; tmp;tmp = tmp->next) {
        group =  getGroupPointer(blk_ptr,tmp);
        fprintf(stderr,"Voltage at the pin %s is %lf,%lf \n",tmp->pinNa
    }
    for(path = blk_ptr->topFuncModel->paths; path;path = path->next) {
       if(path->type == SOURCE) {
          sprintf(token,"i(%s->%s)",path->startNode,path->endNode);
          cpath = getThePath(token,blk_ptr) ;
          fprintf(stderr,"Current seen in the path  %s->%s is %lf,%lf\r
                                                          cpath->valu
       }
       else {
          sprintf(token,"%s",path->startNode);
          val = getGlobalVar(token,blk_ptr) ;
          fprintf(stderr,"Value of  Global  (%s) is %lf,%lf\n",path->s

       }
    }
}
topFunc = blk_ptr->topFuncModel;
 /* Get a copy of the symbol table, since soving process might
    modify the symbol table as and when necessary */
tmpSymTab =  getSymTabCopy(topFunc->symTable);
section   =  topFunc->sections;
/*  Go through each section of the model */
while(section){
  switch(section->section){
     case PARAM :
              /*  SOLVE PARAM SECTION    */
             if(evaluateStmt(section->stmtPtr,blk_ptr,tmpSymTab) == F
               deleteSymTab(tmpSymTab);
               return(FALSE);
             }
             break;

     case WHEN  :   /*  Not yet implemented  */
              if(debugFlag)
                 fprintf(stderr,"WHEN section found, This feature is
              break;
     case VALUE :
             /*  SOLVE VALUE SECTION  */
             if(evaluateStmt(section->stmtPtr,blk_ptr,tmpSymTab) == F
               deleteSymTab(tmpSymTab);
               return(FALSE);
             }
             break;

     case EQN  :
             /*  SOLVE EQUATION SECTION */
             if(evaluateEqn(section->stmtPtr,blk_ptr,tmpSymTab,source
                deleteSymTab(tmpSymTab);
                return(FALSE);
             }
             section->next = NULL;
             break;
     default :
             fprintf(stderr,"(LinATG) Error in mast model of %s\n",b
             deleteSymTab(tmpSymTab);
             return(FALSE);
             break;
    }
    section = section->next;
 }
 deleteSymTab(tmpSymTab);
 return(TRUE);
}/* End of solveMastModel() */

/*------------------------------------------------------------------*/
/* This routine recursively goes thru all the statements */
Int evaluateStmt(stmt,blk_ptr,tmpSymTab)
StmtDef       *stmt;
BlockDef      *blk_ptr;
SymTab        *tmpSymTab;
{
  if(!stmt)
     return(TRUE);
  while(stmt){
    if(compute(stmt,blk_ptr,tmpSymTab) )
       stmt = stmt->next;
    else
       return(FALSE);
  }
  return(TRUE);
}
/*------------------------------------------------------------------*/
/* This routine solve the equation section of the model            */
Int  compute(stmt,blk_ptr,tmpSymTab)
BlockDef     *blk_ptr;
SymTab       *tmpSymTab;
StmtDef      *stmt;
ModelSource *source;
{
 OrdExp       *expr;
 LinString    temp_cond;
 Int          flag;
 char         string[MAX_LENGTH];

  if(debugFlag)
     fprintf(stderr,"getEquation is called \n");

   while(stmt){
     if(stmt->condFlag == TRUE){
        temp_cond = copyString(modifyExp(blk_ptr,tmpSymTab,stmt->cond));
        if(temp_cond == NULL)
           return (NULL);
        flag = evalcond(temp_cond) ;
        deleteString(temp_cond);

        if(flag){
           expr = getEquation(blk_ptr,tmpSymTab,stmt->ifTrue,source);
           if(expr)
              return(expr);
        }
        else{
           expr = getEquation(blk_ptr,tmpSymTab,stmt->ifFalse,source);
           if(expr)
              return(expr);
        }
     }
     else
     if(source->type == SOURCE){
        if(stmt->expr.currstmt->condFlag == FALSE){
            if(strcmp(stmt->expr.currstmt->currexp->pin1,source->startNc
               if(stmt->expr.currstmt->currexp->pin2){
                 if(strcmp(stmt->expr.currstmt->currexp->pin2,source->en
                    sprintf(string,"i(%s->%s)",stmt->expr.currstmt->curr
                                               stmt->expr.currstmt->curr
                    expr = (OrdExp*) calloc(1,sizeof(OrdExp));
                    expr->lhs = copyString(string);
                    if(debugFlag)
                       fprintf(stderr,"Equation for the SOURCE is %s = %
                                      stmt->expr.currstmt->currexp->exp
                    expr->rhs = copyString(stmt->expr.currstmt->currexp-
                    return(expr);
                 }

               }
               else
               if(strcmp(source->endNode,"0") == 0 ) {
                  sprintf(string,"i(%s->0)",stmt->expr.currstmt->currexp
                  expr = (OrdExp*) calloc(1,sizeof(OrdExp));
                  expr->lhs = copyString(string);
                  expr->rhs = copyString(stmt->expr.currstmt->currexp->
                  if(debugFlag)
                       fprintf(stderr,"Equation for the SOURCE is %s = %
                                      stmt->expr.currstmt->currexp->exp
                  return(expr);
```

```
   }
   else
      return(FALSE);
}

/*------------------------------------------------------------------------*/
/* This routine evaluates the equation sectin of the model                */
Int   evaluateEqn(stmt,blk_ptr,tmpSymTab,source,outPut)
StmtDef      *stmt;
BlockDef     *blk_ptr;
ModelSource  *source;
Complex      *outPut;
{
OrdExp       *tmpExp = NULL;
Complex      tmp1,tmp2;
LinString    str1;
LinString    str2;

   tmpExp =  getEquation(blk_ptr,tmpSymTab,stmt,source);
   if(!tmpExp) {
      fprintf(stderr,"(LinATG)Error. Equation not found for the source in mast
      exit_LinATG();
   }
   if(debugFlag)
      fprintf(stderr,"Eqn returned by getEquation() is s %s = %s \n",tmpExp->lh

   str1   =  copyString(modifyExp(blk_ptr,tmpSymTab,tmpExp->lhs));
   str2   =  copyString(modifyExp(blk_ptr,tmpSymTab,tmpExp->rhs));

   if(debugFlag)
         fprintf(stderr,"Modified Eqn is %s = %s \n",str1,str2);

   if(!str1 || !str2) {
      deleteString(str1);
      deleteString(str1);
      deleteString(tmpExp->lhs);
      deleteString(tmpExp->rhs);
      free(tmpExp);
      return(FALSE);
   }

   calculate(str1,&tmp1);
   calculate(str2,&tmp2);


   outPut->rpart  = tmp1.rpart  - tmp2.rpart;
   outPut->ipart  = tmp1.ipart  - tmp2.ipart;
   if(debugFlag)  {
      fprintf(stderr,"Value %f +i  %f\n",outPut->rpart,outPut->ipart);
      fprintf(stderr,"---------SolveMastModel() completed ------------------\n"
   }

   /* free the memory occupied by strings and tmpExp */
   deleteString(str1);
   deleteString(str2);
   deleteString(tmpExp->lhs);
   deleteString(tmpExp->rhs);
   free(tmpExp);
}
/*------------------------------------------------------------------------*/
/***********************************************************************
 * This routine searches thru equation section to get the equation to *
 * be solved for the corresponding source                              *
 ***********************************************************************/
OrdExp *getEquation(blk_ptr,tmpSymTab,stmt,source)
 /*
  Author          : Nandakumar G.N.
  Date Created    : 24 Jun 1992
  Date Modified   : 24 Jun 1992
  Description

     Introduction

          Module should able to identify the Mixed Signal devices with
       digital pins, and should able to activate only the necessary section
       (which is found out by path sensitization, explained elsewhere) to
       generate the particular test plan. This is called  Partial Activation
       or Isolation .

       A Mixed Mode Blocks is a block having digital pins and analog INPUT and
       OUTPUT pins. e.g. A/D convertor, D/A convertor, Controlled gain amplifi
       Current implementation handles only digital controlled blocks and multi

     Assumption

     1. Netlist extracted from the HDL database is kept in a suitable data-str

     2. The digraph information for each of the MAST MODEL is available,
        in the form of a data-structure, as in the Data-Structure section.

     Theory

     Example 1:

          After identifying the analog suppose the ciruit forms the following
          configuration.
                            Ctrl1
          +---------+        _|_
       ___| Analog  |______|   |____
          | Sections|      |_ _|    +
          +---------+               |
                                    |
                            Ctrl2   |           +--------+
          +---------+        _|_    |           |Analog  |
       ___| Analog  |______|   |____|+----------|Sections|------
          | Sections|      |___|    +           |        |
          +---------+               |           +--------+
                            Ctrl3   |
          +---------+        _|_    |
       ___| Analog  |______|   |____+
          | Sections|      |___|
          +---------+

          In this particular circuit, all switch setting should get activated.


     Inputs

     1) Net list data-structure.

     2) Circuit Diagraph data-structure.

     3) The trial-number, which specifies how many times it has failed for thi
     To be reset to zero when simulation solves.


     Output

     1) Pin settings on all the digital pins of the device, which makes
     circuit 'active' all across, ensuring propagation of values.
     It is assumed that all digital pins are design I/Os

     Data Structure

     Procedure

     step 0: Isolate Pure digital blocks appearing in the interface portion
             of the chip (Either all inputs are digital or all output pins
             are digital or both)

     step 1: Identify  the  blocks  having  digital pins.
            (Go to each block. If it has a pin of type logic_4 (Convention use
             MAST models) it is a block with digital pin.)

     step 2: Identify the pins to be activated, by using 'path sensatization'.
             procedure is documents elsewhere
```

```
            }
            else
            if(strcmp(source->endNode,"GND") == 0) {
               sprintf(string,"i(%s->GND)",stmt->expr.currstmt->curre
               expr = (OrdExp*) calloc(1,sizeof(OrdExp));
               expr->lhs = copyString(string);
               expr->rhs = copyString(stmt->expr.currstmt->currexp->
               if(debugFlag)
                    fprintf(stderr,"Equation for the SOURCE is %s = %
                                   stmt->expr.currstmt->currexp->ex
               return(expr);
            }
         }
      }
   }
   else
   if(source->type == GLOBAL_VAR){
       if(stmt->expr.currstmt->condFlag == TRUE){
         if(strcmp(stmt->expr.currstmt->condStmt->tag,source->startN
            expr = (OrdExp*) calloc(1,sizeof(OrdExp));
            expr->lhs = copyString(stmt->expr.currstmt->condStmt->ex
            expr->rhs = copyString(stmt->expr.currstmt->condStmt->ex
            if(debugFlag)
                  fprintf(stderr,"Eqution for the GLOBAL is %s = %
            return(expr);
         }
       }
    }

  stmt = stmt->next;
 }
 if(debugFlag) {
    fprintf(stderr,"(LinATG) Error. Equation for the %s not found  in
                   (source->type == SOURCE)?"SOURCE":"GLOBAL",blk_ptr
 }
 return(NULL);
}
```

```
return 0;
}

/*************************************************************************/
/*

  This routine sets norm values to all the input pins and find
  the ctrl pin combination for which the sensitivity is high.

  Assumptions
     1. A range is given along with each input pin.
     2. All the path currents thru the block are zero.

*/

int   setCtrls(blkPtr)
BlockDef *blkPtr;
{
ModelPins       *model_pin;
double           normValue;
CtrlPinList     *firstPtr ;
CtrlPinList     *listPtr;
BlockDef        *tempBlock;
FuncModelPins   *tmpPin;
SymTab          *tmpSymTab;
Int              i;
PinDef          *pin_ptr;
PinDef          *pin_ptr1;
Int             noOfCtrlPins = 0;
Int             combs = 0;
PinDef          *inputPin:  /* sensitized  input   pin  */
PinDef          *outputPin; /* sensitized  output  pin  */
LinString       outPinName;
LinString       inPinName;
double          out1,out2;  /* output voltage before & after changing
                                sensitized input pin */
double          sensitivity ;
double          tmpsensitivity;
Int             ctrlPinComb = -1;
double          delta;
GroupDef        *group;
Int              outPutFlag = TRUE;
Int              inputFlag  = TRUE;
int              count_byte = 0 ;

extern int         memoryInUse ; /* Dynamic memory in use.
                                            by the process  */

 ActivePins *dummyPins = NULL;

  memoryInUse =mallinfo().uordblks;  /* space in ordinary blocks in use


  if(blkPtr->statusFlag == TRUE)
  {
      pin_ptr = blkPtr->pins;
      model_pin = blkPtr->modelBlock->pin_ptr;
      for(;pin_ptr; pin_ptr = pin_ptr->next,model_pin = model_pin->next)
      {
              if( (model_pin->pinType  == INPUT) &&
                  (pin_ptr->sensitized == TRUE)  &&
                  (inputFlag == TRUE)            &&
                  (model_pin->activePins != NULL)
                )
              {     /* set the active pins and return */
                    for(dummyPins = model_pin->activePins;dummyPins;dumm
                    {
                       pin_ptr1 = findPin(blkPtr,dummyPins->pinName);
                       group = getGroupPtrFromName(pin_ptr1->signal->gro
                       group->known   = TRUE;
                       group->status  = CTRL;
                       group->value.rpart = dummyPins->value;
                       group->value.ipart = 0;
                    }
                    fprintf(stderr,"Controls set from block model for bl
                    return 0;
              }
          }
   }

   if(debugFlag)
      fprintf(stderr,"setCtrls() is called \n");
```

```
step 3: Do sensitivity  for the input and output  selected with each
        digital pin combination.

          Set all the input pins to the nom (Normal) value given .
          For each possible control pin setting do the following

             compute output voltage
             (voltage seen on the output pin which is marked).

             change the voltage at the input pin (selected) and
             again compute the output voltage.

                                        v2 - v1
             sensitivity =           ---------
                                          v2

*/
#include <math.h>
#include "includes.h"
#include "NetlistFuncTypes.h"
#include "PropFuncTypes.h"
#include "UtilFuncTypes.h"
#include "ModelFuncTypes.h"
#include "Functionality.h"

Int activateMixedMode()
{
BlockDef *blkPtr;
PinDef   *pin;

 if(debugFlag)
    printf("ActivateMixedBlock() is called \n");
 for(blkPtr = firstBlock->child;blkPtr;blkPtr =getNextBlk(blkPtr)){
    if(blkPtr != blkUnderTest ){
       for(pin = blkPtr->pins;pin;pin= pin->next) {
           if(getPinType(pin,blkPtr) == LOGIC_4){
               setCtrls(blkPtr);
               break;
           }
       }
    }
 }
    if(debugFlag) fprintf(stderr,"-----------------------------------------

       if( -(pin_ptr->sensitized == TRUF     (inputFlag == TRUE) ) {          /*
          inPinName = copyString(pin_pt:     aName):
          if(pin_ptr->maxval == MAXNUM  .. pin_ptr->minval == MINNUM)        */
             delta = 1:
          else
             delta = (pin_ptr->maxval - pin_ptr->minval)/10;
          inputFlag = FALSE:
       }
    }
    else
    if(model_pin->pinType  == OUTPUT) {
       if( (pin_ptr->sensitized == TRUE) && (outPutFlag == TRUE) )  {
          outPinName = copyString(pin_ptr->pinName);
          pin_ptr->voltFlag = TOFIX;
          outPutFlag = FALSE;
       }
       else {
          setPin(pin_ptr,0,'v');
       }
    }
    else
    if(model_pin->pinType  == INOUT) {
      normValue = (pin_ptr->maxval + pin_ptr->minval)/2;
      setPin(pin_ptr,normValue,'v');
    }
    else
    if(model_pin->pinType  == POWER) {
       group =  getGroupPointer(blkPtr,pin_ptr);
       setPin(pin_ptr,group->value.rpart,'v');
    }
 }

 if(debugFlag)
      fprintf(stderr,"Sensitized path for the block %s  is %s -> %s \n",b
 if( (outPutFlag == TRUE) || (inputFlag == TRUE) ) {
    fprintf(stderr,"?(LinATC) Error. No INPUT or OUTPUT found for the mix
                   blkPtr->instName);
    exit_LinATC();
 }


/*
  Total no.of ctrl pin combinations
*/
  combs = (int)pow(2.0,(double)noOfCtrlPins);
  sensitivity = 0;

/*
    find sensitivity for different ctrl pin combinations
*/


  for(i = 0; i < combs;i++) {

        tmpSymTab  = getSymTabCopy(blkPtr->topFuncModel->symTable);
        tempBlock  = allocateBlock(NULL);
        copyBlock(blkPtr,tempBlock);
        outputPin = findPin(tempBlock,outPinName);
        outputPin->voltFlag = TOFIX;

    /******************************************************
     *  Call evalModel() with norm values and after       *
     *  changing the value on the sensitized input pin.   *
     ******************************************************/

       if(evalModel(blkPtr,tempBlock,tmpSymTab,SOLVE) == TRUE) {
          if(outputPin->voltFlag != TOFIX) {
               out1 = outputPin->volts.dc->val.fixedval ;
               deleteSymTab(tmpSymTab);
               deleteBlock(tempBlock);
               tmpSymTab = NULL;
               tempBlock = NULL;

               inputPin = findPin(blkPtr,inPinName);
               inputPin->volts.dc->val.fixedval += delta;
               tmpSymTab  = getSymTabCopy(blkPtr->topFuncModel->symTable);
               tempBlock  = allocateBlock(NULL);
               copyBlock(blkPtr,tempBlock);
               outputPin = findPin(tempBlock,outPinName);
               outputPin->voltFlag == TOFIX;

               if(evalModel(blkPtr,tempBlock,tmpSymTab,SOLVE) == TRUE){
                   outputPin = findPin(tempBlock,outPinName);
                   if(outputPin->voltFlag !=TOFIX) {
                      out2 =  outputPin->volts.dc->val.fixedval;
                      deleteSymTab(tmpSymTab);
                      deleteBlock(tempBlock);
                      tmpSymTab = NULL;
                      tempBlock = NULL;
                      if(out2 == 0)
                         tmpsensitivity = 0;
                      else
                         tmpsensitivity =  fabs((out2 - out1)/out2);

                      if(sensitivity < tmpsensitivity ){
                         sensitivity = tmpsensitivity ;
                         ctrlPinComb = i;
                      }
                   }
                   else {
                      deleteSymTab(tmpSymTab);
                      deleteBlock(tempBlock);
                   }
               }
               else {
                 deleteSymTab(tmpSymTab);
                 deleteBlock(tempBlock);
```

```
/*
      setting norm values at all input pins of the block
*/
  firstPtr  = NULL;
  listPtr   = NULL;
  tmpPin    = blkPtr->topFuncModel->modelPins;

/*
       Construct a link list of ctrl pins in the block
       and initialize the values on the ctrl pins
*/

   for(;tmpPin;tmpPin = tmpPin->next) {
       if(tmpPin->type == LOGIC_4) {
          noOfCtrlPins++;
          if(!listPtr){
            listPtr = allocCtrlPinList(NULL);
            firstPtr = listPtr;
          }
          else
             listPtr = allocCtrlPinList(listPtr);
          listPtr->pinName  = copyString(tmpPin->name);
          pin_ptr = findPin(blkPtr,tmpPin->name);
          if (pin_ptr->volts.dc == NULL)
               pin_ptr->volts.dc  = allocateDCval();
          pin_ptr->volts.dc->valtype        = FIXEDVAL;
          pin_ptr->voltFlag                 = FIXED;
          if (pin_ptr->volts.dc->units != NULL)
               deleteString(pin_ptr->volts.dc->units);
          pin_ptr->volts.dc->units = copyString("V");
          pin_ptr->volts.dc->val.fixedval = 0;
          pin_ptr->ctrlStatus = 0;
          listPtr->state = 0;
       }
   }

   if(blkPtr->statusFlag == TRUE) {

        pin_ptr = blkPtr->pins;
        model_pin = blkPtr->modelBlock->pin_ptr;

        for(;pin_ptr; pin_ptr = pin_ptr->next,model_pin = model_pin->nex
            if(model_pin->pinType  == INPUT)  {
               normValue = (pin_ptr->maxval + pin_ptr->minval)?2;
               setPin(pin_ptr,normValue,'v');

/*
      get (    trl pin setting for which sensitivity is the highes
*/
      for(listPtr = firstPtr;listPtr;listPtr = listPtr->next)  {
        listPtr->state = 0;
      }
      for(i=0;i < ctrlPinComb;i++)
          getNextComb(firstPtr,blkPtr);

   }
   else {
      fprintf(stderr,"?(LinATC):Error,Could not find a ctrl settinc
      exit_LinATC();
   }

}
       /*  set ctrl pins of the block from the ctrlPins list */

  if(debugFlag)
   {
      fprintf(stderr,"------------------------------------------\n"
      fprintf(stderr,"Ctrl pin Values set for the block %s \n",blkPtr-
  }
 for(listPtr = firstPtr;listPtr;listPtr = listPtr->next)  {
      pin_ptr = findPin(blkPtr,listPtr->pinName);
      group = getGroupPtrFromName(pin_ptr->signal->groupName);
      group->known   = TRUE;
      group->status  = CTRL;
      if(listPtr->state == 1) {
        if(debugFlag)
            fprintf(stderr,"PinName %s Group %s  Value set is = 1\n"
                                                 pin_ptr->pinName,
                                                 group->groupName);
        pin_ptr->volts.dc->val.fixedval = 1;
        group->value.rpart = 1;
        group->value.ipart = 0;
        pin_ptr->ctrlStatus = 1;
      }
      else {
        if(debugFlag)
            fprintf(stderr,"PinName %s Group %s  Value set is = 0\n"
                                                pin_ptr->pinName,
                                                group->groupName);
        pin_ptr->volts.dc->val.fixedval = 0;
        pin_ptr->ctrlStatus = 0;
        group->value.rpart = 0;
        group->value.ipart = 0;
      }
   }

/*
     free ctrlPin list
*/
     deleteCtrlPinList(firstPtr);

}

/*********************************************************************/
/* This routine gets the type of the pin (ELECTRICAL/LOGIC_4)       */
Int getPinType(pin,blk)
PinDef      *pin;
BlockDef    *blk;
{
FuncModelPins  *modelPin;

   modelPin = blk->topFuncModel->modelPins ;
   for(;modelPin;modelPin = modelPin->next){
       if(strcmp(modelPin->name,pin->pinName) == 0)
           return(modelPin->type);
   }
   return(0);
}
```

```
            }
            inputPin->volts.dc->val.fixedval == delta;
         }
         else {
            deleteSymTab(tmpSymTab);
            deleteBlock(tempBlock);
         }
      }
      else {
         deleteSymTab(tmpSymTab);
         deleteBlock(tempBlock);
      }
      getNextComb(firstPtr,blkPtr);
   }

   deleteString(outPinName);
   deleteString(inPinName);

   if (ctrlPinComb != -1) {
```

```
#include <stdio.h>
#include "includes.h"
#include "NetlistFuncTypes.h"

extern pdBlock        *findPath();
extern LinString      copyString();
MeasPin               *allocMeasurePin();

/*-----------------------------------------------------------------
           Function: sensitizePath()
           Purpose:  selects the path in case of multiplexers/demultiplexers.
           Author:   Srinivasa Rao K.
           Description:

General:
           Given a block and pin, it is necessary to find all the mixed mode
           block from that pin to a design Input/Output and set the control
           pins (basically digital) appropriately so that the current test
           can be performed. Also a list of all the design Outputs connected
           to this pin is required to generate "measure" statements for this
           test. This function selects an input and output of all the mixed
           mode blocks identified as mentioned above and sets a flag for these
           two pins so that control pins of these blocks can be assigned
           appropriate values by some other function.

This function:

           If the pin passed to this function is a design Input this function
           returns without doing any thing. If the pin is a design Output,
           it includes the pin in the Design Output Pin List (measurePinlist)
           and returns.

           If the pin is not a design IO, it finds out all the blocks and
           their pins connnected to this pin. For each of these blocks the
           following procedure is repeated.

           If any pin of the block is of type CTRL, it is identified as a
           mixed mode block. If the pin of this block is an output pin,
           any one input pin and this output pin are sensitized. If the
           pin is an input pin, any one output pin and this input pin
           are sensitized. If the pins sensitized are design IOs, this
           process stops here else this function is called recursively
           by passing this block and the sensitized pin.

           If the block is not of mixed mode type and the connected pins
           are not design IOs,

           If the pin is an Input pin, this function is called once for
           each output pin.
           If the pin is an Output pin, this function is called once for
           each Input pin.

           If the pin is a design Input nothing is done.
           If the pin is a design Output, it is inclued in the Output Pin
           List.
-----------------------------------------------------------------*

int sensitizePath(blockPtr, pinPtr, measurePin, measurePinlist)
BlockDef               *blockPtr;
PinDef          *pinPtr;
MeasPin         **measurePin, **measurePinlist;
{
samePins    blockList[MAX_LENGTH];
int         i,index;
samePins        *tempPtr;
Int                     mixedMode;
PinDef          *tempPinPtr;
MeasPin         *tempMeasPin;
LinString       tempName;
GroupDef        *tempGroup;

      if(debugFlag)
           fprintf(stdout, "Entered sensitizePath()\n");

      if(pinPtr->designIO == TRUE) {
          if(pinPtr->status == OUTPUT) {
             tempPinPtr = pinPtr;
             tempGroup = getGroupPointer(blockPtr,tempPinPtr);
             tempName = tempGroup->groupName;
             for(tempMeasPin = *measurePinlist;tempMeasPin;tempMeasPin = tempMe
                tempGroup = getGroupPointer(tempMeasPin->blockPtr,tempMeasPin->
                if(!strcmp(tempGroup->groupName,tempName)) break;
             }
             if (tempMeasPin == NULL) {
                     (*measurePin) = allocMeasurePin(*measurePin);
             if (*measurePinlist == NULL)
                        *measurePinlist = *measurePin;
                     (*measurePin)->pinPtr = tempPinPtr;
                (*measurePin)->blockPtr = blockPtr;
                if(debugFlag)
                   printf("Measure this pin: %s\n",(*measurePin)->pinPtr->pinNa
             }

          }
          return 0;
       }

     if (blockPtr->statusFlag == FALSE) {
             blockPtr->statusFlag = TRUE;
     index = findSameSig(blockPtr,pinPtr,blockList);
     for( i = 0; i < index ; i++) {
        tempPtr = &(blockList[i]);  /* Pointer of the structure returned by
                                        findSameSig */
                 mixedMode = FALSE;
                 for (tempPinPtr = tempPtr->block_ptr->pins; tempPinPtr;
                        if (tempPinPtr->status == CTRL) {
                               mixedMode = TRUE;
                               break;
                        }
                 }
                 if (mixedMode == TRUE)  {   /*  If the block is of mixe

                        if (tempPtr->pin_ptr->status == OUTPUT) {
                        tempPtr->pin_ptr->sensitized = TRUE;
                               /* Sensitize any one of the input pins
                               for(tempPinPtr = tempPtr->block_ptr->pi
                                      if (tempPinPtr->status == INPUT
                               tempPinPtr->sensitized = TRUE;
                               if(debugFlag)  {
                        fprintf(stderr,"Block Name: %s   Status Flag = %
                        fprintf(stderr,"Selected Output Pin: %s\n",tempP
                        fprintf(stderr,"Selected Input  Pin: %s\n",tempP
             }
                               /* call sensitizePath() for this pin an

                               if (tempPinPtr->designIO != TRUE)
                                      sensitizePath(tempPtr->block_pt
```

```
lse
   tempPtr->block_ptr->statusFlag = TRUE;
            }
            else if (tempPtr->pin_ptr->status == INPU

            tempPtr->pin_ptr->sensitized = TRUE;

            /*  Add the output pins which are designI

                    for(tempPinPtr = tempPtr->block_p
                           if (   (tempPinPtr->statu
                 tempGroup = getGroupPointer(tempPtr->
                 tempName = copyString(tempGroup->grou
                 for(tempMeasPin = *measurePinlist;tem
                     tempGroup = getGroupPointer(temp
                     if(!strcmp(tempGroup->groupName,
                 }
                 if (tempMeasPin == NULL) {
                                          (*measurePin
                                          if (*measure
                                                 *mea
                                          (*measurePin
          (*measurePin)->blockPtr = tempPtr->block
                     if(debugFlag)
                          printf("Measure this pin: %
                 }
                            }

                     /*  Sensitize any one of the outp

                     for(tempPinPtr = tempPtr->block_
                            if (tempPinPtr->status =
                     tempPinPtr->sensitized = TRUE;

                     if(debugFlag)  {
            fprintf(stderr,"Block Name: %s\n",tempPtr-
            fprintf(stderr,"Selected Output Pin: %s\n"
            fprintf(stderr,"Selected Input  Pin: %s\n"
}

                     if(tempPinPtr->designIO != TRUE)
                        sensitizePath(tempPtr->block_
else
   tempPtr->block_ptr->statusFlag = TRUE;
           }
    }
    else  {                     /*  If the block is not
 if(debugFlag) {
     fprintf(stdout, "Block name: %s\n",tempPtr->bl
     fprintf(stdout, "This block is not a mixed mod
  }
           if (tempPtr->pin_ptr->status == INPUT) {

                  /* Sensitize this block with res
                  for(tempPinPtr = tempPtr->block_
                         if (tempPinPtr->status =
                                if (tempPinPtr->
                                       sensitiz
                                else {
                   tempGroup = getGroupPointer(tem
                   tempName = copyString(tempGroup
                   for(tempMeasPin = *measurePinli
                      tempGroup = getGroupPointer(
                      if(!strcmp(tempGroup->groupN
                   }
                   if (tempMeasPin == NULL) {
                                                (*
                                                if

                                                (*
                                                (*
                         if(debugFlag)
                             printf("Measure this
                   }
                              }
                       }
           }
           else if (tempPtr->pin_ptr->status == OU
                  for (tempPinPtr = tempPtr->block
                         if (tempPinPtr->status =
                                sensitizePath(tc
           }
      }
   }
  }
  return 0;
}

/*-----------------------------------------------------------------
                                        Function: allocMeasureP
                                        Author:   Srinivasa Rao
                                        Purpose:          alloca
                 Description:
                            Allocates memory for each structure
                            the information of a design Output
-----------------------------------------------------------------
MeasPin  *allocMeasurePin(measurePin)
MeasPin *measurePin;
{
  MeasPin  *tempcurMeasPin = NULL;
  tempcurMeasPin=(MeasPin *)calloc(1,sizeof(MeasPin));
  if (!(tempcurMeasPin==NULL))
  {

    if(measurePin == NULL)
       measurePin = tempcurMeasPin;
    else
       measurePin->next = tempcurMeasPin;
    tempcurMeasPin->next==NULL;
    return tempcurMeasPin;
  }
  else
  {
    fprintf(stderr,"No Memory.\nAborting.\n");
    exit(2);
  }
 }
```

```c
#include <math.h>
#include "includes.h"
#include "NetlistFuncTypes.h"
#include "PropFuncTypes.h"
#include "UtilFuncTypes.h"
#include "ModelFuncTypes.h"
#include "Functionality.h"
#include "solution.h"

/*------------------------------------------------------------------
            Function: modelInfo()
            Purpose:  Extracts the model information in terms of dependent
                      voltage and current sources.
            Author:   Srinivasa Rao K.
            Description:

General:     This function generates a list of sources and global variables
             from the data structures output by Mast Parser. In case of sources,
             it also gives the names of the pins between which the source is
             connected whereas in the case of global variables it just gives the
             name of the varibale. The type of the source is not mentioned in
             the information i.e., voltage or current.

This function:
             Picks up the EQUATIONS section of the model and calls the
             "findStmts()" function to scan each statement within EQN. section.

------------------------------------------------------------------*
int     modelInfo(BlockDef *blkPtr)
{
   FuncModel      *ptr;
   SymTab         *tempSymTab;
   ModelPaths     *tempModelPath;

   tempSymTab = getSymTabCopy(symTable);
   tempModelPath = NULL;


   /* GOTO EQN SECTION OF THE MODEL */
   for(ptr = expPtr; ptr && ptr->section != EQN; ptr = ptr->next);

   if(ptr == NULL) {
      printf("  ERROR  >>  Equations section not found for the block.\n");
      return(1);
   }

   findStmts(ptr->stmtPtr, tempSymTab, &tempModelPath, blkPtr);

   if (debugFlag)
      dbgModelInfo(blkPtr);

   return(0);
}
/*------------------------------------------------------------------
            Function: findStmts()
            Author:   Srinivasa Rao K.
            Description:

             This function checks the type of each statement i.e., conditional
             or not. By conditional statement, it is meant that it contains an
             if (cond) {    } else {  }  statement. If the statement is not
             conditional, the function "scanStmt()" is called with pointer to
             that statement as an argument.

             If the statement is conditional, the condition is evaluated and
             "findStmts()" function is called with either the TRUE part or
             FALSE part depending on the value of the condition. The value can
             be TRUE or FALSE.

------------------------------------------------------------------*


int     findStmts(StmtDef   *stmtPtr,      SymTab  *tempSymTab,
            ModelPaths **tempModelPath, BlockDef *blkPtr)
{
LinString       cond;
StmtDef         *ptr;

   for(ptr = stmtPtr; ptr ; ptr = ptr->next) {
      if(ptr->condFlag == FALSE)
         scanStmt(ptr->expr.currstmt, tempModelPath);
      else {
         cond = copyString( modifyExp(blkPtr,tempSymTab,ptr->cond,0) );
         if(evalcond (cond) == TRUE)
            findStmts(ptr->ifTrue, tempSymTab, tempModelPath,blkPtr);
  /* blk_ptr is added by me. ?How come less arguments. */
         else
            findStmts(ptr->ifFalse, tempSymTab, tempModelPath,blkPtr);
  /* blk_ptr is added by me. ?How come less arguments. */
      }
   }
   return(0);
}
/*------------------------------------------------------------------
            Function: scanStmt()
            Author:   Srinivasa Rao K.
            Description:

             This function classifies the given statement into two types
             1. source 2. global variable.
             If the statment is of type i1:V(out) = some_expression,
             it is a global variable. Hence the type of the statement is
             GLOBAL_VAR and the varible name is 'i1'.

             If the statement is of type i(p1->p2) = some_expression,
             it represents a source. Hence the type of the statement is
             SOURCE , startNode is 'p1' and endNode is 'p2'.
------------------------------------------------------------------*
int     scanStmt(CurrStmt  *currstmt, ModelPaths **tempModelPath)
{
CurrExp*        tempCurrExp;

   *tempModelPath = allocModelPath(*tempModelPath);
   if(firstModelPath == NULL)
       firstModelPath = *tempModelPath;

   if(currstmt->condFlag == FALSE) {    /*Not equations of the type i1:V(out)=
      tempCurrExp = currstmt->currexp;

      (*tempModelPath)->type = SOURCE;
      (*tempModelPath)->startNode = copyString(tempCurrExp->pin1);
      if(tempCurrExp->pin2 == NULL)
         (*tempModelPath)->endNode = copyString("GND");
      else
         (*tempModelPath)->endNode = copyString(tempCurrExp->pin2);
   }
   else {                 /* If the statment is CONDITIONAL */
      (*tempModelP...->type = GLOBAL_VAR;

      /* Copy the variable name into startNode of ModelPath */
      (*tempModelPath)->startNode = copyString(currstmt->condStmt->tag);
   }
}
/*------------------------------------------------------------------
            Function: allocModelPath()
            Author:   Srinivasa Rao K.
            Description:
             This function allocates memory to a structure that contains
             the information of a statement in the EQUATIONS section of
             the MAST model.
------------------------------------------------------------------
ModelPaths *allocModelPath(ModelPaths  *curModelPath)
{
  ModelPaths  *tempcurModelPath = NULL;
  tempcurModelPath=(ModelPaths *)calloc(1,sizeof(ModelPaths));
  if (!(tempcurModelPath==NULL))
  {

    if(curModelPath==NULL)
       curModelPath=tempcurModelPath;
    else
       curModelPath->next=tempcurModelPath;
    tempcurModelPath->next==NULL;
    return tempcurModelPath;
  }
  else
  {
    fprintf(stderr,"No Memory.\nAborting.\n");
    exit(2);
  }
}
/*------------------------------------------------------------------
            Function: dbgModelInfo
            Author:   Srinivasa Rao K.
            Description:
             This function is meant for debugging purpose. This prints so
             intermediate information to the standard output when the pro
             is invoked with "debug" option.
------------------------------------------------------------------
int    dbgModelInfo(blkPtr)
BlockDef *blkPtr;
{
   ModelPaths    *ptr;

   fprintf(stdout, "Entered dbgModelInfo.\n");
   fprintf(stdout, "Block Name  %s\n",blkPtr->blockName);
   if((ptr = firstModelPath) == NULL)
      fprintf(stdout, " Initial Pointer is NULL.\n");
   for(ptr = firstModelPath; ptr; ptr = ptr->next) {
      if(ptr->type == SOURCE)  {
         fprintf(stdout, "Type of statement: SOURCE\n");
         fprintf(stdout, "Start node is    : %s\n",ptr->startNode);
         fprintf(stdout, "End   node is    : %s\n",ptr->endNode);
      }
      else {
         fprintf(stdout, "Type of statement: GLOBAL_VAR\n");
         fprintf(stdout, "Name of variable : %s\n",ptr->startNode);
      }
   }
}
/*--------------------------------------------------------------*/
```

APPENDIX D

```
****** TEST PLAN ******
 (device CASCADE
   (block CASCADE.RES1
     (test R
      (method  1
        (Comment : Voltages to be set . . . )
        (set       IN1                  2.00000)
        (set       IN2                 -0.00004)
        (set       IN3                  0.00000)
        (set       GND                  0.00000)
```

```
    (Comment : Voltages to be measured . . . )
    (measure  OUT2                          1.99993)
    (Comment : End of method.)
   )
    (Comment : End of test.)
  )
  (test RCURR
   (method  1
    (Comment : Voltages to be set . . . )
    (set      IN1                           0.10000)
    (set      IN2                           0.00000)
    (set      IN3                           0.00000)
    (set      GND                           0.00000)
    (Comment : Voltages to be measured . . . )
    (measure  OUT2                          0.09999)
    (Comment : End of method.)
   )
    (Comment : End of test.)
  )
    (Comment : End of block.)
 )
 (block CASCADE.OPAMP
  (test VOO
   (method  1
    (Comment : Voltages to be set . . . )
    (set      IN1                           0.00000)
    (set      IN2                           0.00000)
    (set      IN3                           0.00000)
    (set      GND                           0.00000)
    (Comment : Voltages to be measured . . . )
    (measure  OUT2                          0.00000)
    (Comment : End of method.)
   )
    (Comment : End of test.)
  )
  (test GAIN
   (method  1
    (Comment : Voltages to be set . . . )
    (set      IN1                           5.50020)
    (set      IN2                           0.00000)
    (set      IN3                           0.00000)
    (set      GND                           0.00000)
    (Comment : Voltages to be measured . . . )
    (measure  OUT2                          5.49980)
    (Comment : End of method.)
   )
    (Comment : End of test.)
  )
    (Comment : End of block.)
 )
 (block CASCADE.OPAMP2
  (test VOO
   (method  1
    (Comment : Voltages to be set . . . )
    (set      IN1                           0.00000)
    (set      IN2                           0.00000)
    (set      IN3                           0.00000)
    (set      GND                           0.00000)
    (Comment : Voltages to be measured . . . )
    (measure  OUT2                          0.00000)
    (Comment : End of method.)
   )
```

```
    (Comment : End of test.)
  )
  (test GAIN
   (method  1
    (Comment : Voltages to be set . . . )
    (set      IN1                           0.00000)
    (set      IN2                           2.75020)
    (set      IN3                           0.00000)
    (set      GND                           0.00000)
    (Comment : Voltages to be measured . . . )
    (measure  OUT2                         -5.50000)
    (Comment : End of method.)
   )
    (Comment : End of test.)
  )
    (Comment : End of block.)
)
(block CASCADE.RES4
  (test R
   (method  1
    (Comment : Voltages to be set . . . )
    (set      IN1                           0.00000)
    (set      IN2                           2.00007)
    (set      IN3                           2.00000)
    (set      GND                           0.00000)
    (Comment : Voltages to be measured . . . )
    (measure  OUT2                          0.00000)
    (Comment : End of method.)
   )
    (Comment : End of test.)
  )
  (test RCURR
   (method  1
    (Comment : Voltages to be set . . . )
    (set      IN1                           0.00000)
    (set      IN2                           0.00000)
    (set      IN3                           0.10000)
    (set      GND                           0.00000)
    (Comment : Voltages to be measured . . . )
    (measure  OUT2                          0.20000)
    (Comment : End of method.)
   )
    (Comment : End of test.)
  )
    (Comment : End of block.)
)
(block CASCADE.RES2
  (test R
   (method  1
    (Comment : Voltages to be set . . . )
    (set      IN1                           4.00000)
    (set      IN2                           2.00000)
    (set      IN3                           0.00000)
    (set      GND                           0.00000)
    (Comment : Voltages to be measured . . . )
    (measure  OUT2                          0.00000)
```

```
      (Comment : End of method.)
     )
      (Comment : End of test.)
    )
  (block CASCADE.RES3
    (test R
     (method  1
      (Comment : Voltages to be set . . . )
      (set      IN1                          -2.00007)
      (set      IN2                           0.00000)
      (set      IN3                          -0.00004)
      (set      GND                           0.00000)
      (Comment : Voltages to be measured . . . )
      (measure  OUT2                         -2.00000)
      (Comment : End of method.)
     )
      (Comment : End of test.)
    )
    (test RCURR
     (method  1
      (Comment : Voltages to be set . . . )
      (set      IN1                          -0.10000)
      (set      IN2                           0.00000)
      (set      IN3                           0.00000)
      (set      GND                           0.00000)
      (Comment : Voltages to be measured . . . )
      (measure  OUT2                         -0.10000)
      (Comment : End of method.)
     )
      (Comment : End of test.)
    )
      (Comment : End of block.)
  )
      (Comment : End of Test Plan.)
)


# End of file.
```

What is claimed is:

1. A method of using a computer to automatically generate a test plan for an integrated circuit comprised of blocks of analog or mixed signal components, wherein the number of unknown circuit voltages and currents is greater than the number of available circuit equations, comprising the steps of:

loading a block functional description of the circuit into a computer;

loading predefined block test models for each block of the integrated circuit into the computer;

setting each functional blocks' inputs to values specified by the predefined block test model for them;

automatically determining by the computer whether a sufficient number of block inputs are set by said setting step, such that the number of unknown circuit voltages and currents is the same as the number of available circuit equations;

if said number of inputs is not sufficient, automatically identifying by the computer circuit pins to be set with a known voltage value;

automatically setting by the computer each circuit pin identified during said identifying step with a voltage value;

automatically forming a matrix of circuit equations by the computer whose unknown variables include voltages at those circuit pins not identified in said identifying step;

automatically solving said matrix for said unknown variables by the computer; and listing values provided by said solving step as circuit input values to be applied during a test of said block.

2. The method of claim 1, wherein said identifying step is performed by locating a circuit input that is farthest from the block under test.

3. The method of claim 1, further comprising the step of identifying circuit outputs to be measured during a test of said block.

4. The method of claim 1, wherein said matrix includes unknown circuit outputs and further comprising the step of listing values provided by said solving step as circuit output values to be expected during a test of said block.

5. The method of claim 1, further comprising the step of setting values to power pins of said circuit before said solving step.

6. The method of claim 5, wherein said identifying step is performed if the number of inputs with values set in said setting steps is less than the number of circuit inputs.

7. The method of claim 1, further comprising the step of identifying mixed signal blocks in said circuit and of setting values of at least one input and at least one output of said mixed signal block.

8. The method of claim 1, further comprising the step of identifying and masking any digital blocks in said circuit.

9. The method of claim 1, wherein said step of forming a matrix is accomplished by generating KCL equations for said circuit and at least one functional equation for each block of said circuit.

* * * * *